(12) United States Patent
Marciano et al.

(10) Patent No.: US 10,831,108 B2
(45) Date of Patent: Nov. 10, 2020

(54) METHOD OF ANALYZING AND UTILIZING LANDSCAPES TO REDUCE OR ELIMINATE INACCURACY IN OVERLAY OPTICAL METROLOGY

(71) Applicant: KLA CORPORATION, Milpitas, CA (US)

(72) Inventors: Tal Marciano, Zychron Yaacov (IL); Barak Bringoltz, Rishon LeTzion (IL); Evgeni Gurevich, Yokneam Illit (IL); Ido Adam, Qiriat Ono (IL); Ze'ev Lindenfeld, Modi'n-Macabim-Reut (IL); Zeng Zhao, Shanghai (CN); Yoel Feler, Haifa (IL); Daniel Kandel, Aseret (IL); Nadav Carmel, Mevasseret-Zion (IL); Amnon Manassen, Haifa (IL); Nuriel Amir, St. Yokne'am (IL); Oded Kaminsky, Givat Shemuel (IL); Tal Yaziv, Kiryat Haim (IL); Ofer Zaharan, Jerusalem (IL); Moshe Cooper, Timrat (IL); Roee Sulimarski, Haifa (IL); Tom Leviant, Yoqneam Illit (IL); Noga Sella, Migdal Haemek (IL); Boris Efraty, Carmiel (IL); Lilach Saltoun, Qiriat Ono (IL); Amir Handelman, Hod-Hasharon (IL); Eltsafon Ashwal, Migdal Ha' emek (IL); Ohad Bachar, Timrat (IL)

(73) Assignee: KLA Corporation, Milpitas, CA (US)

( * ) Notice: Subject to any disclaimer, the term of this patent is extended or adjusted under 35 U.S.C. 154(b) by 693 days.

(21) Appl. No.: 15/198,902

(22) Filed: Jun. 30, 2016

(65) Prior Publication Data

US 2016/0313658 A1 Oct. 27, 2016

Related U.S. Application Data

(63) Continuation of application No. PCT/US2015/062523, filed on Nov. 24, 2015.
(Continued)

(51) Int. Cl.
*G03F 7/20* (2006.01)
*H01L 21/66* (2006.01)
*G03F 9/00* (2006.01)

(52) U.S. Cl.
CPC ...... *G03F 7/70633* (2013.01); *G03F 7/70616* (2013.01); *G03F 7/70625* (2013.01);
(Continued)

(58) Field of Classification Search
CPC ............... G03F 9/7003; G03F 7/70616; G03F 7/70625; G03F 7/70633; H01L 22/20; H01L 22/12
See application file for complete search history.

(56) References Cited

U.S. PATENT DOCUMENTS 7,528,941 B2 5/2009 Kandel et al.
8,681,413 B2 3/2014 Manassen et al.
(Continued)

FOREIGN PATENT DOCUMENTS

CN 1672012 A 9/2005
TW 201314174 A 4/2013
(Continued)

OTHER PUBLICATIONS

Office Action dated May 20, 2019 for Taiwan Patent Application No. 104139220.
(Continued)

*Primary Examiner* — Gordon J Stock, Jr.
(74) *Attorney, Agent, or Firm* — Suiter Swantz pc llo

(57) ABSTRACT

Methods are provided for deriving a partially continuous dependency of metrology metric(s) on recipe parameter(s), analyzing the derived dependency, determining a metrology recipe according to the analysis, and conducting metrology measurement(s) according to the determined recipe. The dependency may be analyzed in form of a landscape such as a sensitivity landscape in which regions of low sensitivity and/or points or contours of low or zero inaccuracy are detected, analytically, numerically or experimentally, and used to configure parameters of measurement, hardware and targets to achieve high measurement accuracy. Process variation is analyzed in terms of its effects on the sensitivity landscape, and these effects are used to characterize the process variation further, to optimize the measurements and make the metrology both more robust to inaccuracy sources and more flexible with respect to different targets on the wafer and available measurement conditions.

77 Claims, 19 Drawing Sheets

Related U.S. Application Data

(60) Provisional application No. 62/083,891, filed on Nov. 25, 2014, provisional application No. 62/100,384, filed on Jan. 6, 2015.

(52) U.S. Cl.
CPC ............ *G03F 9/7003* (2013.01); *H01L 22/20* (2013.01); *H01L 22/12* (2013.01)

(56) References Cited

U.S. PATENT DOCUMENTS

| | | | |
|---|---|---|---|
| 9,341,769 B2 | 5/2016 | Manassen et al. | |
| 9,512,985 B2 | 12/2016 | Brady et al. | |
| 9,518,916 B1* | 12/2016 | Pandev | G01N 21/255 |
| 9,851,300 B1* | 12/2017 | Bringoltz | G03F 7/70633 |
| 9,874,527 B2* | 1/2018 | Amit | G01N 21/8851 |
| 9,903,711 B2* | 2/2018 | Levy | G01N 21/9501 |
| 9,910,953 B2* | 3/2018 | Adel | G03F 1/36 |
| 9,977,340 B2* | 5/2018 | Aben | G03F 7/70483 |
| 10,095,121 B2* | 10/2018 | Holovinger | H01L 22/12 |
| 10,365,230 B1* | 7/2019 | Amit | G03F 9/7049 |
| 10,571,811 B2* | 2/2020 | Amit | G03F 7/70633 |
| 2004/0017574 A1 | 1/2004 | Vuong et al. | |
| 2012/0022836 A1 | 1/2012 | Ferns et al. | |
| 2013/0035888 A1 | 2/2013 | Kandel et al. | |
| 2013/0262044 A1 | 10/2013 | Pandev et al. | |
| 2014/0060148 A1* | 3/2014 | Amit | G01B 21/042 73/1.79 |
| 2014/0136137 A1* | 5/2014 | Tarshish-Shapir | G06T 7/0004 702/108 |
| 2014/0257734 A1 | 9/2014 | Bringoltz et al. | |
| 2016/0042105 A1* | 2/2016 | Adel | G06F 30/20 703/6 |
| 2016/0161864 A1* | 6/2016 | Middlebrooks | G03F 7/70633 355/67 |

FOREIGN PATENT DOCUMENTS

| | | |
|---|---|---|
| TW | 201329417 A | 7/2013 |
| TW | 201346214 A | 11/2013 |
| WO | 2014062972 A1 | 4/2014 |

OTHER PUBLICATIONS

Office Action dated Feb. 3, 2020 for CN Patent Application No. 201580060081.7.

* cited by examiner

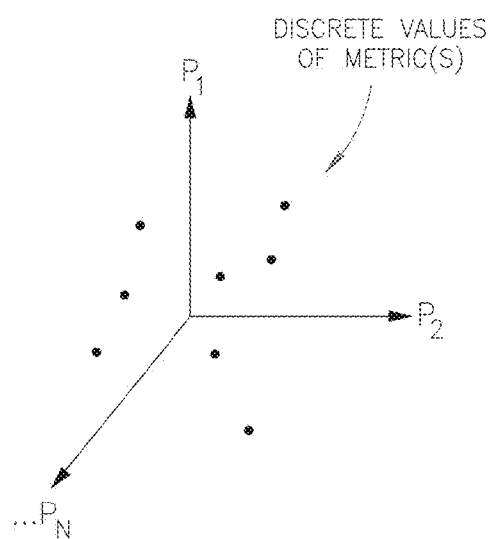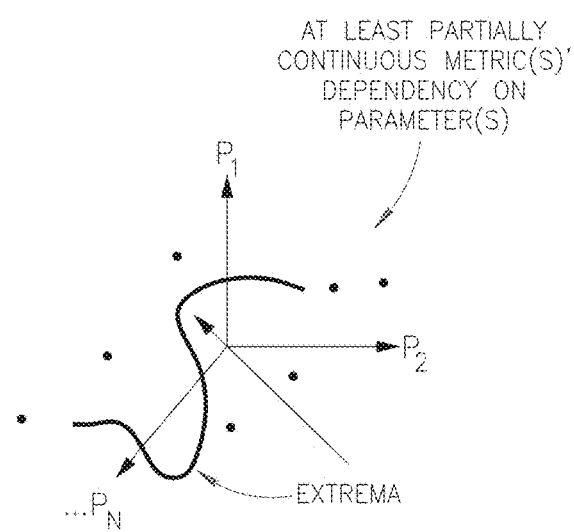
Figure 6A
PRIOR ART
Figure 6B

_100_

```
┌─────────────────────────────────────────────────────┐
│ DERIVING AND ANALYZING AN AT LEAST PARTIALLY        │
│ CONTINUOUS DEPENDENCY OF ONE OR MORE                │
│ METROLOGY METRIC ON ONE OR MORE RECIPE PARAMETER    │
└─────────────────────────────────────────────────────┘
```
_105_

```
┌─────────────────────────────────────────────────────┐
│ DERIVING OR MEASURING A DEPENDENCY                  │
│ OR A LANDSCAPE OF METROLOGY METRIC(S)               │
│ ON MEASUREMENT PARAMETER(S)                         │
└─────────────────────────────────────────────────────┘
```
_110_

```
┌─────────────────────────────────────────────────────┐
│ USING AN OVERLAY VARIATION                          │
│ MEASURE AS A METROLOGY METRIC                       │
└─────────────────────────────────────────────────────┘
```
_112_

```
┌─────────────────────────────────────────────────────┐
│ USING PARAMETERS WHICH QUANTIFY AN                  │
│ OPTICAL PATH DIFFERENCE BETWEEN TARGET              │
│ STRUCTURAL ELEMENTS                                 │
└─────────────────────────────────────────────────────┘
```
_115_

```
┌─────────────────────────────────────────────────────┐
│ IDENTIFYING EXTREMA IN THE                          │
│ DEPENDENCY OR LANDSCAPE                             │
└─────────────────────────────────────────────────────┘
```
_120_

```
┌─────────────────────────────────────────────────────┐
│ IDENTIFYING AN EXTREMUM BY NULLIFYING A             │
│ DERIVATIVE OF THE METRIC(S) WITH RESPECT            │
│ TO THE PARAMETER(S)                                 │
└─────────────────────────────────────────────────────┘
```
_122_

```
┌─────────────────────────────────────────────────────┐
│ IDENTIFYING EXTREMA EXPERIMENTALLY ACCORDING        │
│ TO MEASUREMENTS AND/OR SIMULATION RESULTS           │
└─────────────────────────────────────────────────────┘
```
_124_

```
┌─────────────────────────────────────────────────────┐
│ CARRYING OUT THE IDENTIFICATION ON THE FLY          │
└─────────────────────────────────────────────────────┘
```
_126_

```
┌─────────────────────────────────────────────────────┐
│ DETERMINING ONE OR MORE METROLOGY RECIPE            │
│ ACCORDING TO THE ANALYZED AT LEAST PARTIALLY        │
│ CONTINUOUS DEPENDENCY                               │
└─────────────────────────────────────────────────────┘
```
_128_

Figure 11

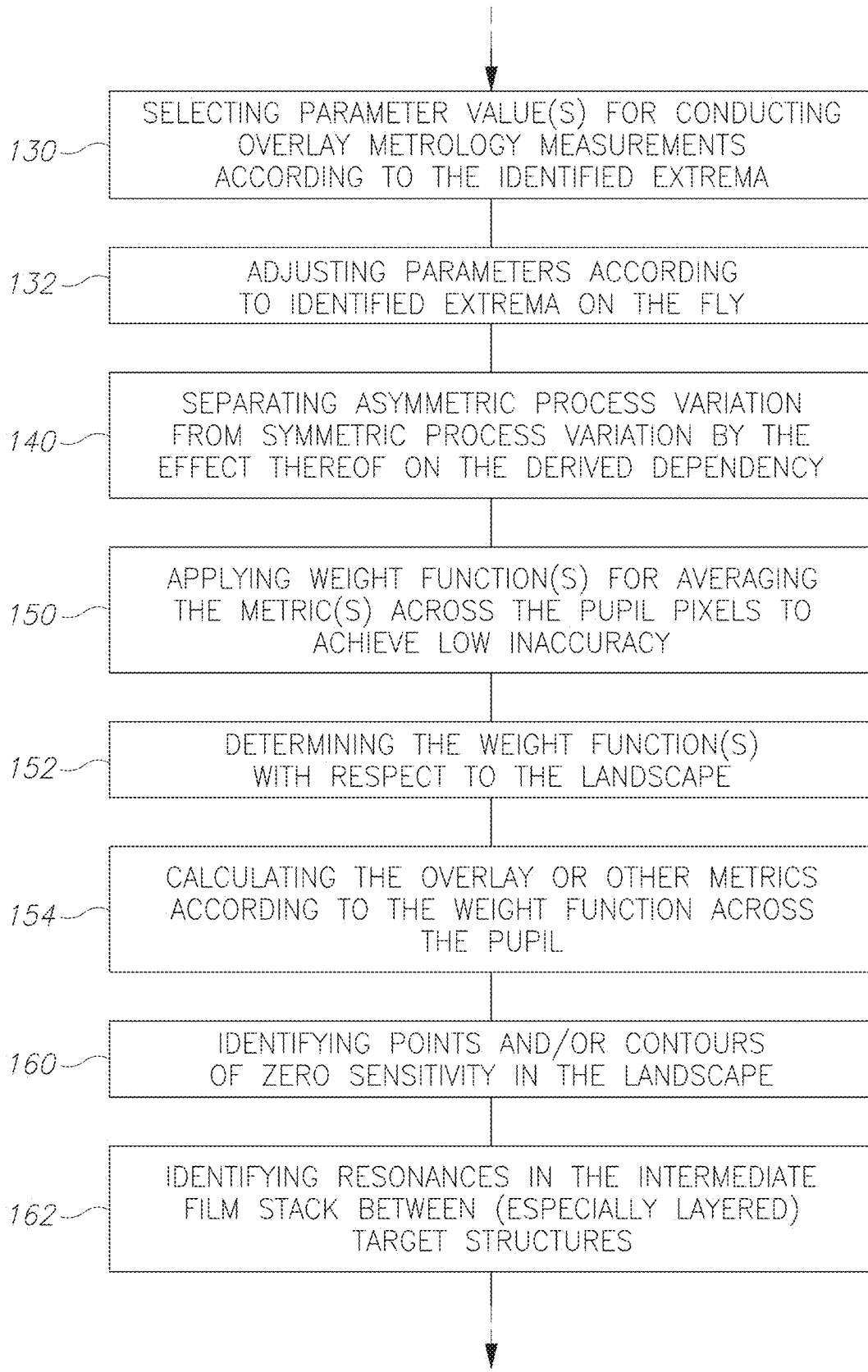
Figure 11 (cont. 1)

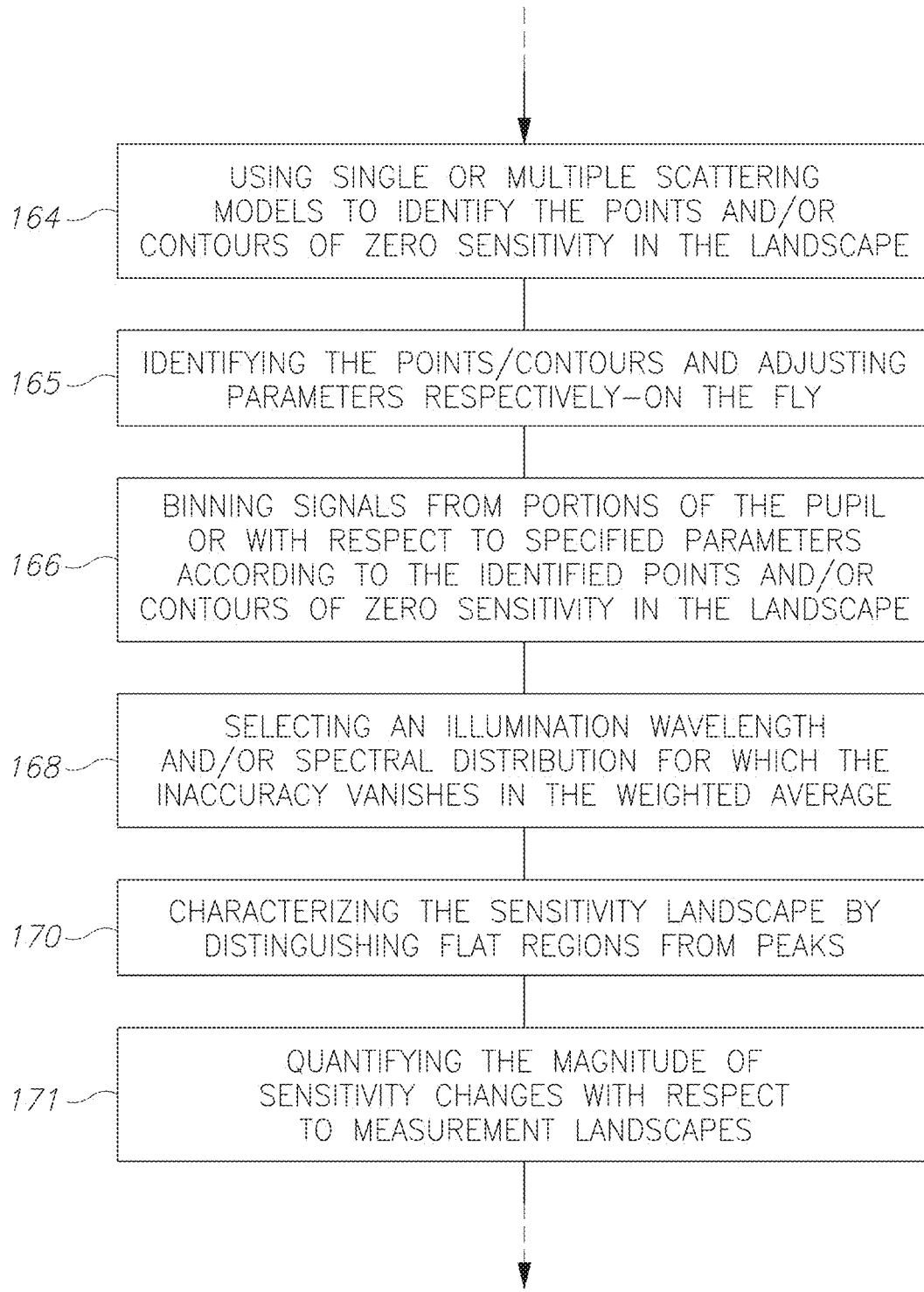
Figure 11 (cont. 2)

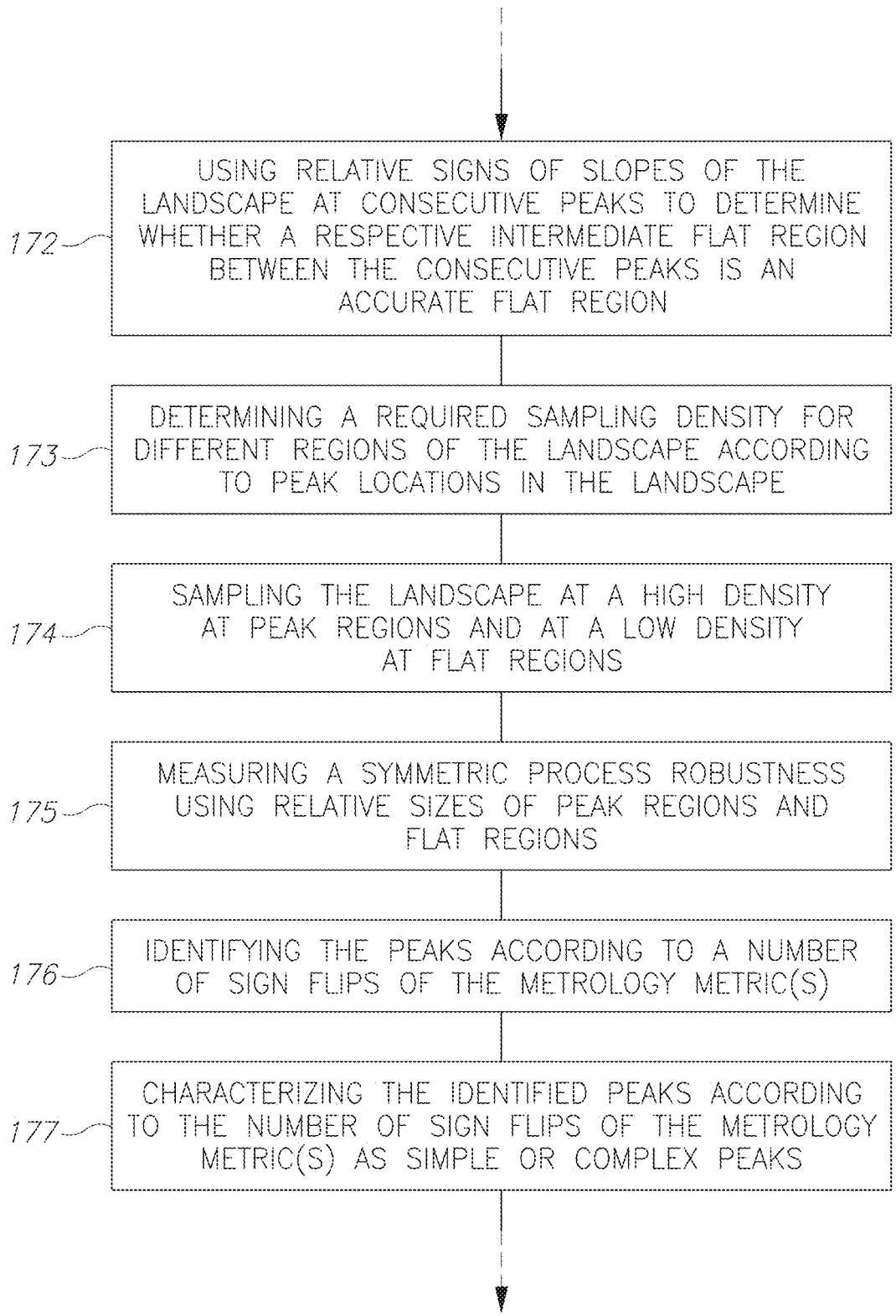
Figure 11 (cont. 3)

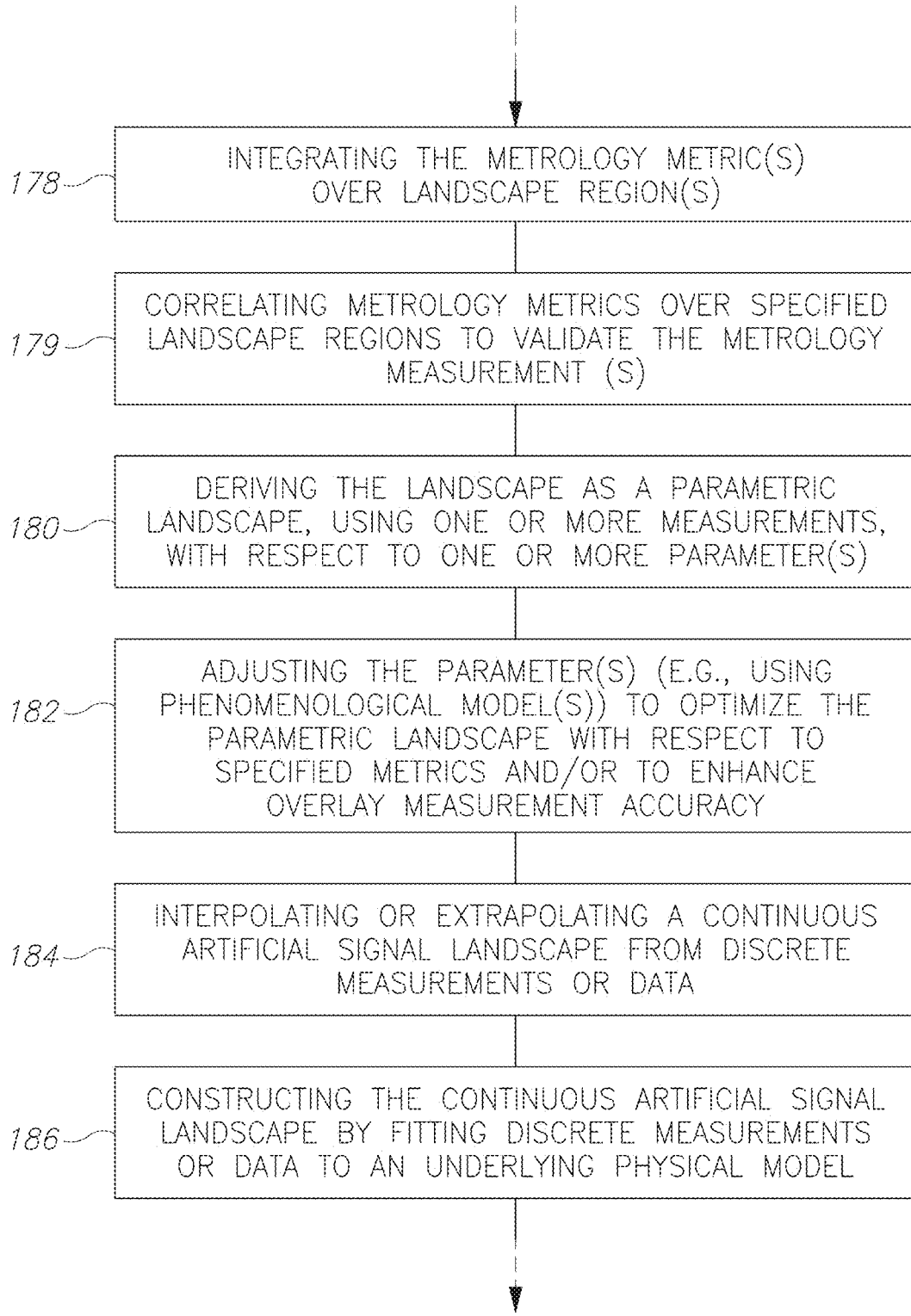
Figure 11 (cont. 4)

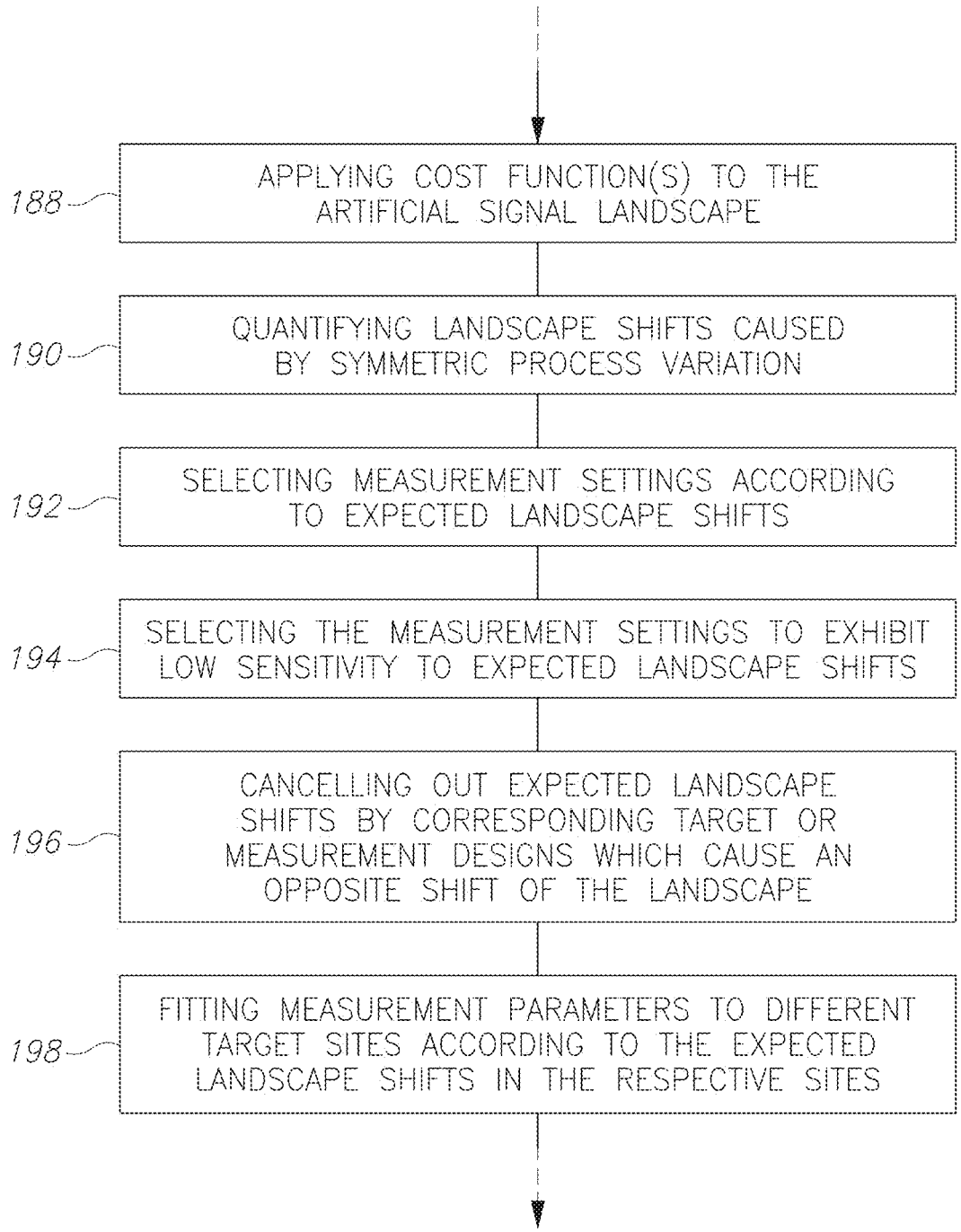
Figure 11 (cont. 5)

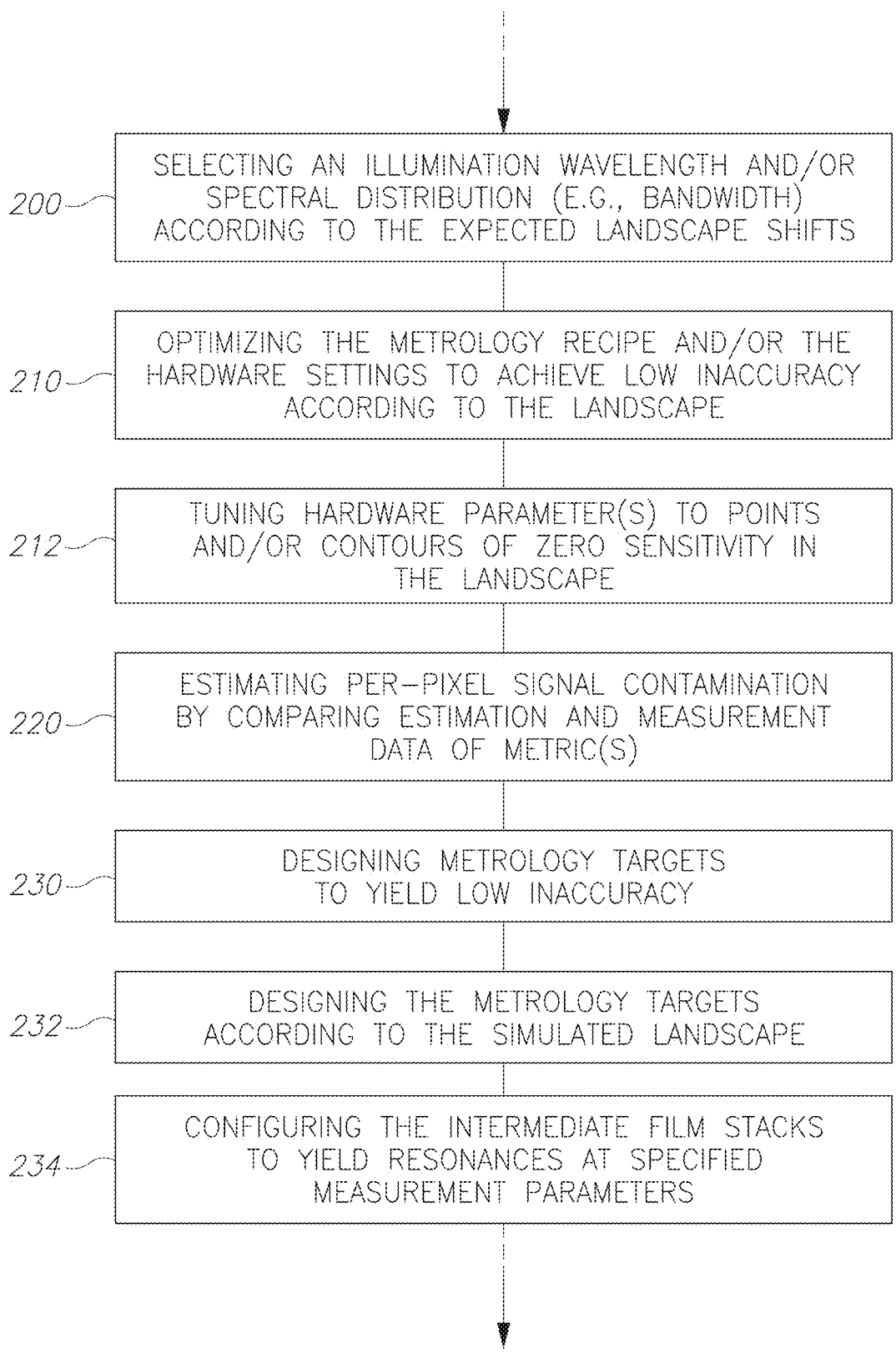
Figure 11 (cont. 6)

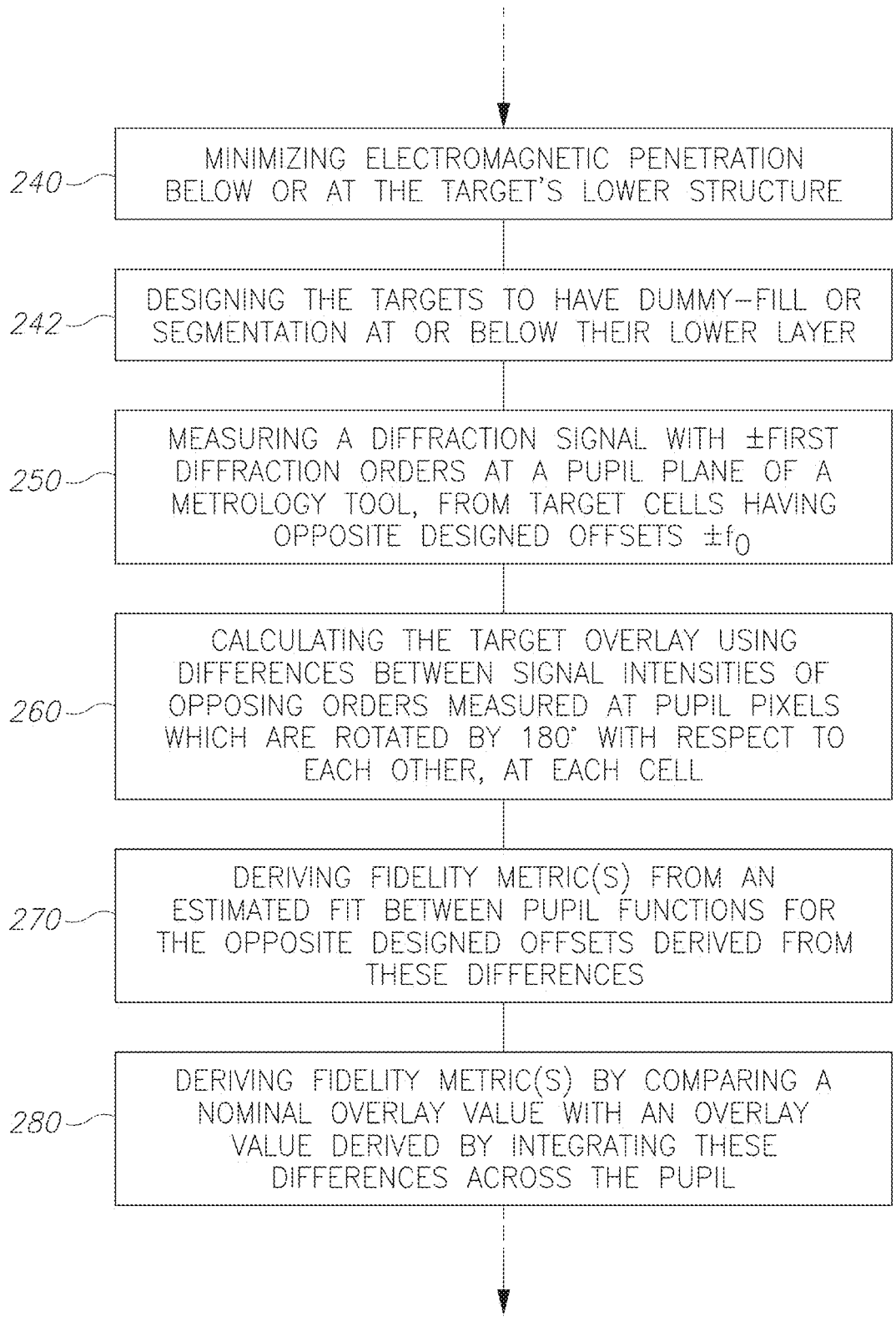
Figure 11 (cont. 7)

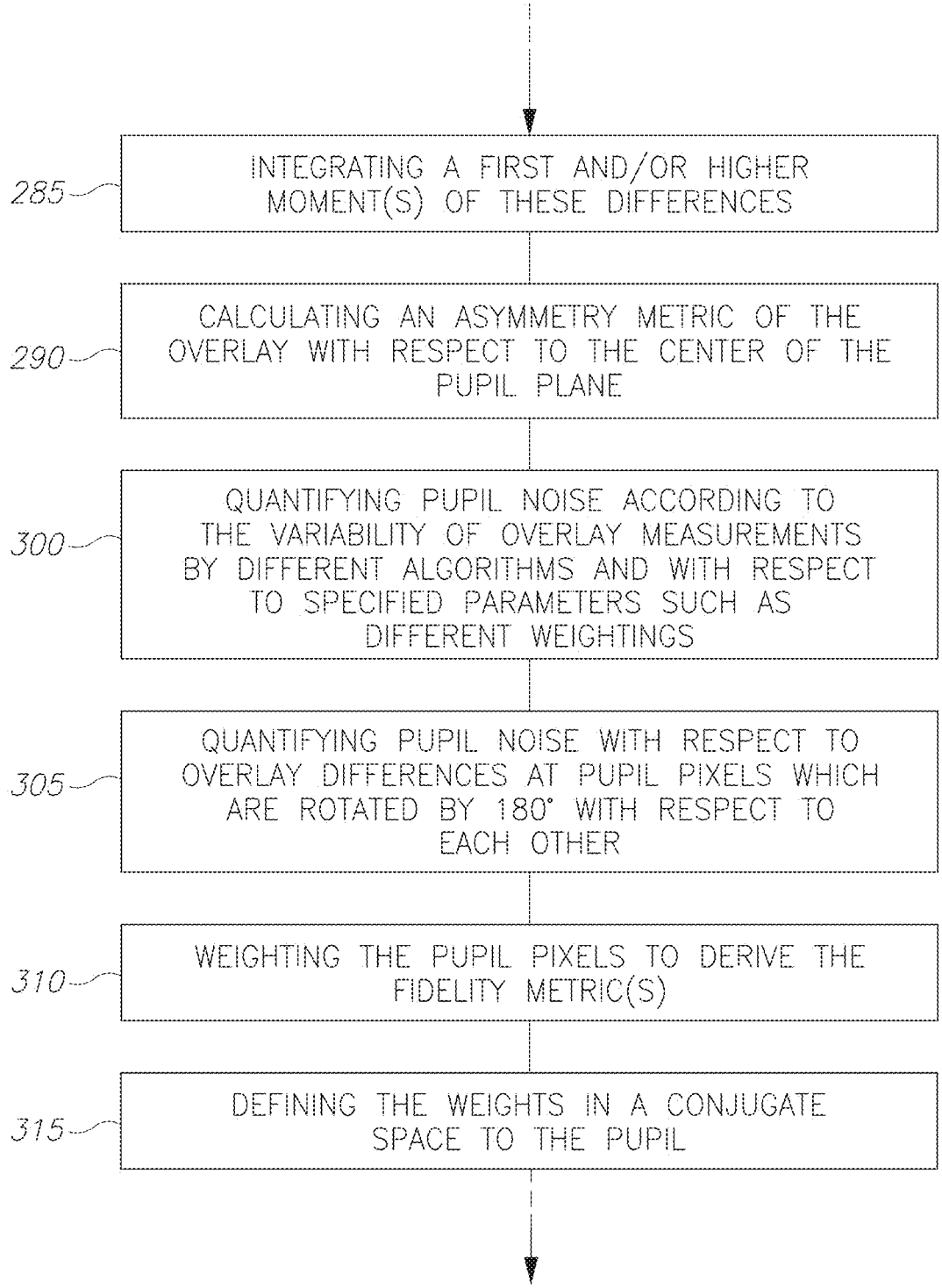
Figure 11 (cont. 8)

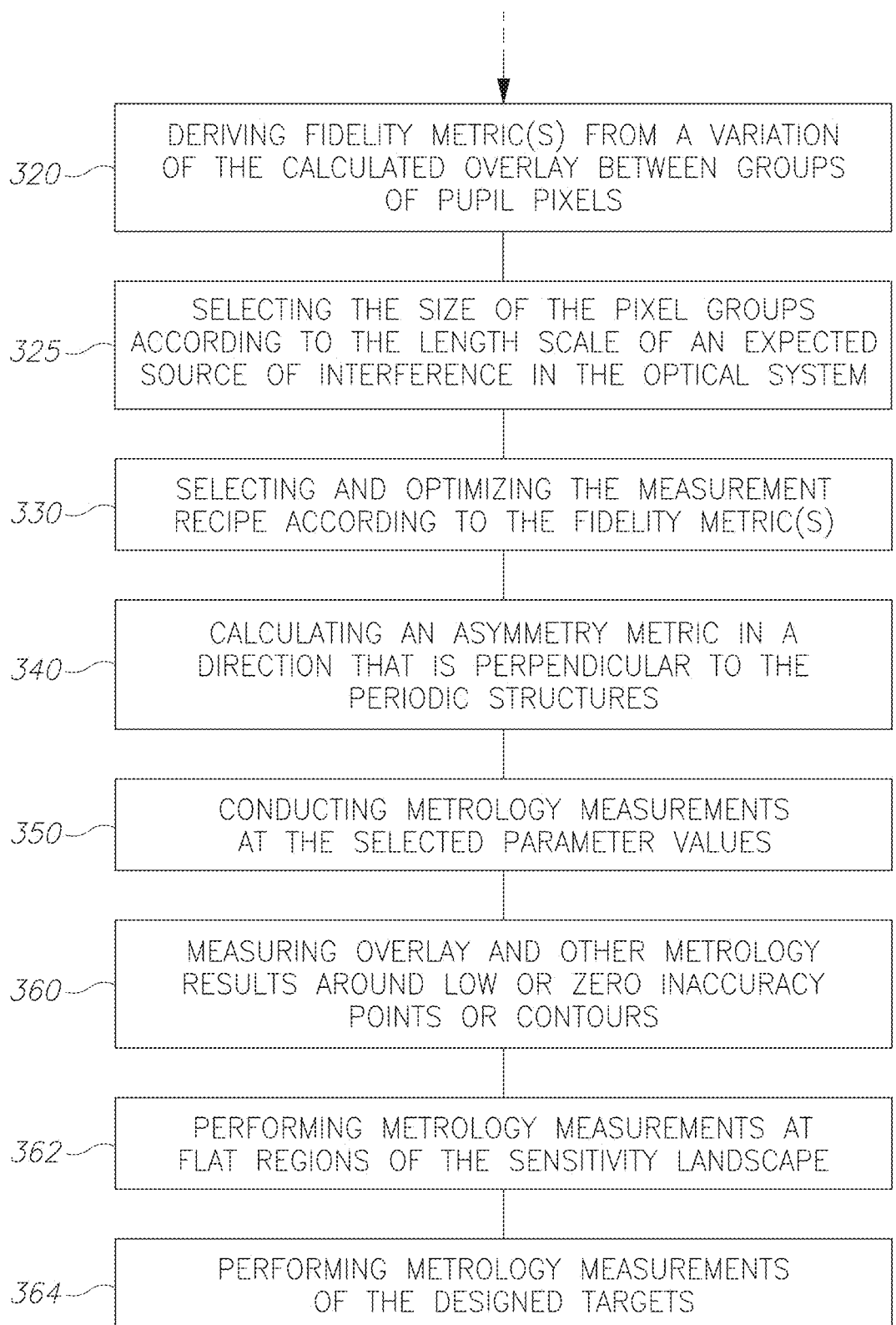
Figure 11 (cont. 9)

METHOD OF ANALYZING AND UTILIZING LANDSCAPES TO REDUCE OR ELIMINATE INACCURACY IN OVERLAY OPTICAL METROLOGY

CROSS REFERENCE TO RELATED APPLICATIONS

This application is filed under 35 U.S.C. § 111(a) and § 365(c) as a continuation of International Patent Application Serial No PCT/US2015/062523, filed Nov. 24, 2015 which application claims the benefit of U.S. Provisional Patent Application No. 62/083,891 filed on Nov. 25, 2014 and of U.S. Provisional Patent Application No. 62/100,384 filed on Jan. 6, 2015, which are incorporated herein by reference in their entirety.

FIELD OF THE INVENTION

The present invention relates to the field of metrology, and more particularly, to reducing or eliminating the inaccuracy in overlay optical metrology.

BACKGROUND OF THE INVENTION

Optical metrology technologies usually require that the process variations that cause asymmetry in the metrology signal be much smaller than some threshold so that their part of the asymmetry signal is much smaller than the signal asymmetry caused by the overlay. In reality, however, such process variations may be quite large (especially in the research and development phase of chip development) and they may induce sizeable errors in the overlay reported by the metrology. Optical metrology technologies have an accuracy budget which can be as large as a few nanometers. This is true for all types of optical overlay metrologies including imaging based, scatterometry based (where the detector is placed either in the pupil or the field) and derivations thereof. However, the errors from process variation may reach the nanometer regime, thereby consuming a significant part of the overlay metrology budget.

Optical overlay metrology is a metrology of the asymmetry carried by the metrology signal that is due to the overlay between two lithography steps. This asymmetry is present in the electromagnetic signal because the latter reflects the interference of electric fields with relative phases that carry the overlay information. In overlay scatterometry (be it pupil scatterometry or field scatterometry) the overlay mark is commonly a grating-over-grating structure and the overlay information is carried in the relative phase of the lower and upper gratings.

In overlay scatterometry of the side-by-side type (see, e.g., WIPO Publication No. 2014062972, incorporated herein by reference in its entirety), the overlay mark (i.e., the metrology target) may comprise a grating next to a grating structure and the overlay information may also be carried in the relative phase of the lower and upper gratings.

In overlay imaging the overlay mark (i.e., the metrology target) consists of separate marks for the separate layers and the overlay information is carried in the position of each individual mark on the detector which, in turn, is a result of interferences between different diffraction orders of the individual marks.

Current methodologies for reducing measurement inaccuracies involve performing large scale recipe and target design optimizations for accuracy and TMU (total measurement uncertainty) which minimizes the overlay-induced asymmetry in the signal and the asymmetries caused by other process variations. For example, the best combination of recipe and target may be chosen out of a large variety of options in the form of a near-exhaustive search. In another example, optimization metrics are derived from the metrology signal or from external calibration metrologies.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a method comprising deriving, by simulation or in preparatory measurements, an at least partially continuous dependency of at least one metrology metric on at least one recipe parameter, analyzing the derived dependency, determining a metrology recipe according to the analysis, and conducting at least one metrology measurement according to the determined recipe.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIGS. 6A and 6B are high level schematic illustrations of metrology metrics which are calculated with respect to metrology parameters, according to the prior art (FIG. 6A) and according to some embodiments of the invention (FIG. 6B);

DETAILED DESCRIPTION OF THE INVENTION

Figure 1:
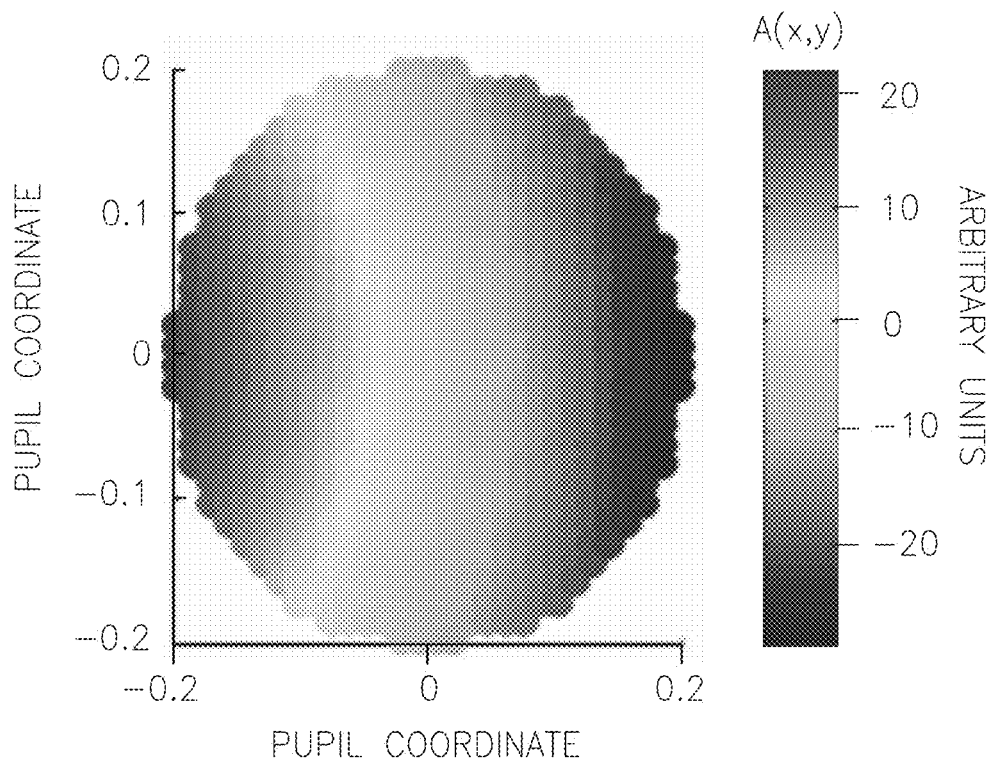
FIG. 1 presents an example for contour lines in simulated per-pixel overlay sensitivity, according to some embodiments of the invention.

Prior to the detailed description being set forth, it may be helpful to set forth definitions of certain terms that will be used hereinafter.

The terms "metrology target" or "target" as used herein in this application, are defined as any structure designed or produced on a wafer which is used for metrological purposes. Specifically, overlay targets are designed to enable measurements of the overlay between two or more layers in a film stack that is produced on a wafer. Exemplary overlay targets are scatterometry targets, which are measured by scatterometry at the pupil plane and/or at the field plane, and imaging targets. Exemplary scatterometry targets may comprise two or more either periodic or aperiodic structures (referred to in a non-limiting manner as gratings) which are located at different layers and may be designed and produced one above the other (termed "grating-over-grating") or one adjacent to another from a perpendicular point of view, (termed "side-by-side"). Common scatterometry targets are referred to as SCOL (scatterometry overlay) targets, DBO (diffraction based overlay) targets and so forth. Common imaging targets are referred to as Box-in-Box (BiB) targets, AIM (advance imaging metrology) targets, AIMid targets, Blossom targets and so forth. It is noted that the invention is not limited to any of these specific types, but may be carried out with respect to any target design. Certain metrology targets exhibit an "induced offset", also termed "design offset" or "designed misalignment", which is, as used herein in this application, an intentional shift or overlay between the periodic structures of the target. Target elements, such as features of the periodic structures, elements between features of the periodic structures (e.g., areas between grating bars) and elements in the background (i.e., lower or upper layers) may be segmented (for features) or dummyfied (for gaps between features), namely designed and/or produced to have periodic or non-periodic features at a smaller scale than the features of the periodic structures and commonly at a different orientation (e.g., perpendicular) to the features of the periodic structures.

The terms "landscape", "performance landscape", "landscape signature" or "LS" as used herein in this application, are defined as a dependency of one or more metrology metric(s), e.g., scatterometry overlay (SCOL) metrics, on one or more parameter. The terms "sensitivity landscape", "accuracy landscape" and "accuracy signature" as used herein in this application, are examples for landscapes which relate to sensitivity or accuracy metrics, respectively. An example used throughout the description is of the overlay and Pupil3S variation as a function of process parameters, measurement parameters and target parameters. Using the overlay variation is merely a non-limiting example, which may be replaced by any other metrology metric. The landscapes or signatures are understood as a way to visualize the dependency of the metric(s) on the parameter(s) and are not limited to continuous dependencies, to analytical dependencies (expressible as functions) nor to specific ways by which the dependency is derived (e.g., experimentally, by simulation or analytically). It is noted that any of the parameters may be understood to have discrete values or continuous values, depending on specific measurement settings. In certain embodiments, landscapes comprise an at least partially continuous dependency, or a densely sampled dependency, of at least one metrology metric on at least one recipe parameter.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Current methodologies for reducing measurement inaccuracies, which were described above, have the following shortcomings, namely, (i) it is very hard to reliably estimate the inaccuracy of the metrology in train and nearly impossible to do so in run time using traditional recipe optimization. For example, one can use CDSEM after decap to calibrate the measurement, but this step can be done only infrequently and the SEM inaccuracy budget is possibly also at the nanometer level; (ii) the presence of process variations that are symmetric as defined below (for example, a change in a certain layer's thickness of an overlay mark), may make the recipe optimization obsolete since, while in train, where recipe A showed to be best, in run (or research and development), one finds that the process variations caused it to be poorly performing. Such a problem may also take place across the wafer (for example, recipe A is optimal for the wafer center but very poorly performing at the edge); and (iii) specifically in the context of overlay field scatterometry there is a fundamental problem: the very nature of that metrology technique is to average pupil signals by hardware parameters (since it performs measurements in field plane). This is in contrast to pupil overlay scatterometry which averages the per-pupil-pixel overlay algorithmically. The direct hardware parameters average of the pupil signals leads to many situations of the dramatic loss in overlay sensitivity. In particular, because different illumination angles have different overlay sensitivities and because these sensitivities often vary in their sign and not only amplitude, the hardware parameters average of the pupil signal often averages the pupil overlay sensitivity to zero. This is despite the fact that the per-pixel sensitivity is often very good in absolute value and so, when treated algorithmically (as it does by pupil overlay scatterometry), this problem disappears.

Advantageously, certain embodiments disclosed below overcome these difficulties in pupil overlay scatterometry by the use of hardware adjustments and algorithms, and overcome these difficulties in field overlay scatterometry with hardware adjustments. The disclosed methodologies improve the metrology overlay sensitivity and overlay performance, including accuracy, and achieve superior accuracy in optical metrology and deliver very small inaccuracies both in run time and train.

Referring to the three common types of overlay targets (grating-over-grating scatterometry targets; side-by-side scatterometry targets; imaging targets), the inventors note that the sensitivity of the signal (i.e., the extent by which the signal asymmetry is affected by the overlay) is primarily affected by the change in the size of the interference term in these signals. For example, in scatterometry targets some of the terms in the interference phase depend on the optical path difference between light scattered from the lower and upper gratings, which is linear in the thickness of the film stack separating them and inversely proportional on the wavelength. Hence, the interference term also depends on other parameters like the angle of incidence, or reflectance, and on the polarization properties of the incident and reflected light; as well as on the target attributes and the electromagnetic characteristics of the stack and the gratings. In imaging targets, the interference phase is also linear in the tool's focus and depends on other parameters such as the incident angles.

Disclosed solutions refer to an "accuracy landscape" or a "performance landscape", which describe the dependencies of the accuracy signature on the tool recipes like the wavelength of the light, the polarizer angles, and the apodization function, which result from the underlying physics governing the accuracy landscape of the stack. The disclosure analyzes universal structures which were found to govern accuracy landscapes at many specific cases. In contrast, current optimization procedures are not guided by any systematic rules related to the accuracy landscape.

Observing how the sensitivity of the metrology tool depends on the tool parameters in a continuous fashion, and in particular on various differentials of many of the metrology characteristics (such as the first, second, and higher derivatives of the sensitivity on wavelength, focus, polarization, etc.) reveals the form of the performance landscape related to any nominal stack. The inventors discovered, using simulations and theory, that this landscape is universal in the sense that is largely independent of many types of process variations including all those that break the symmetry of the overlay mark and cause inaccuracy. While tool performances also include inaccuracies which, by definition, strongly depend on the asymmetric process variations as defined below, the inventors have found out that it is the accuracy landscape that determines at which sub-sections of the landscape the sensitivity of the accuracy to the process variations is the strongest and at which sub-sections it is the weakest, and generally how the sensitivity can be characterized. The inventors have discovered, that to a large extent, the same regions that are sensitive to process variation of a certain type are also sensitive to all other types of process variations as determined by the sensitivity to overlay of a "nominal" stack (i.e., the stack with no asymmetric process variations).

Methods are provided of deriving, by simulation or in preparatory measurements, an at least partially continuous dependency of at least one metrology metric on at least one recipe parameter, analyzing the derived dependency, determining a metrology recipe according to the analysis, and conducting at least one metrology measurement according to the determined recipe. Extremum(ma) may be identified in the dependency of the metrology metric(s) on the parameter(s). The dependency may be analyzed in form of a landscape, such as a sensitivity landscape, in which regions of low sensitivity and/or points or contours of low or zero inaccuracy are detected, analytically, numerically or experimentally, and used to configure parameters of measurement, hardware and targets to achieve high measurement accuracy. Process variation may be analyzed in terms of its effects on the sensitivity landscape, and these effects may be used to characterize the process variation further, to optimize the measurements and make the metrology both more robust to inaccuracy sources and more flexible with respect to different targets on the wafer and available measurement conditions. Further provided are techniques for tuning the inaccuracy and process robustness by using different target designs or recipe designs across the wafer. Methods of controlling the inaccuracy due to process variations across wafer and increasing process robustness by an appropriate recipe choice are also provided.

FIGS. 6A and 6B are high level schematic illustrations of metrology metrics which are calculated with respect to metrology parameters, according to the prior art (FIG. 6A) and according to some embodiments of the invention (FIG. 6B). In the prior art, metrology recipes are selected according to calculation of one or more metrology metric at one or more parameter settings. A metrology recipe is related to a set of metrology parameters $P_1 \ldots P_N$ (types of parameters are exemplified in more detail below). One or more metrology metrics $M_1 \ldots M_k$ are measured with respect to one or more values of one or more parameters $p_i$ ($1 \leq i \leq n \leq N$), commonly on a plurality of sites ($x_1 \ldots x_L$) on the wafer, so that the recipe is selected according to a set of metric values $M_j(p_i, x_1 \ldots x_L)$ ($1 \leq j \leq k$), illustrated schematically in FIG. 6A as a plurality of discrete points. In certain embodiments, at least one metric may be measured at least partially continuously with respect to one or more of the parameters, as illustrated schematically in FIG. 6B. The partial continuity refers to a certain range of one or more parameters. The dependency of the metric(s) on the parameter(s) may comprise points of discontinuity, and may be defined with respect to a large number of discrete parameters values within a small range. Examples for parameters may comprise discrete wavelengths, a discrete set of illumination and collection polarization directions, a discrete set of pupil coordinates, a discrete set of apodizations, etc. as well as combinations thereof. The inventors were able, by analyzing such sets of discrete measurements using algorithmic methods, to reveal the underlying physical continuity which is referred to as the landscape of the metrology accuracy and performance. It is noted that the sampling density of the discrete measurements may be determined by simulation and\or data and depends on the smoothness of the respective underlying physical continuous functions. Extrema (e.g., maxima, minima) may be identified on the at least partially continuous part of the dependency. The full set of parameter values (values of $p_1 \ldots p_N$) and the measurement recipe may be defined according to analysis of the at least partially continuous dependency of the at least one metric ($M_1 \ldots M_k$) on the at least one parameter ($p_1 \ldots p_n$, $1 \leq n \leq N$).

The "accuracy landscape" can be understood as "accuracy signatures" of respective stacks, which arise in the presence of asymmetric process variations, and are determined by the appearance of contour lines (or more generally a locus) of vanishing overlay signal or "overlay sensitivity" in the space of respective recipe parameters. More specifically, and as a non-limiting example, in the case of the scatterometry (both in dark field scatterometry with the detector in the field plane, and in pupil scatterometry), these contours contain a set of connected components of angles which change continuously with the other parameters of the scattered radiation like its wavelength and polarization orientation (the parameters may be discrete or continuous). It is the detection of these contours in data, understanding the underlying physics which governs them, and their universal behavior in the space of asymmetric and symmetric process variations, that opens the door to designing algorithmic and hardware methods that utilize or remove these groups of angles from the detected information, thereby making the metrology more accurate. In similar lines, in the case of imaging based overlay metrology corresponding contours may be identified in the space of wavelength and focus.

FIG. 1 presents an example for contour lines in simulated per-pixel overlay sensitivity, according to some embodiments of the invention, namely a grating-over-grating system. The two-dimensional per-pixel sensitivity function A(x,y) for a front-end stack is presented at a wavelength that contains a "zero-sensitivity contour" in the pupil because of interference effects in the double-grating and film system, which could be regarded as a generalized Wood's anomaly. The units are arbitrary normalized units (high values reaching 20 are at the left side of the illustrated pupil, low values reaching −20 are at the right side of the illustrated pupil and the zero contour is somewhat off the center to the left) and the x and y axis are normalized axes of the illumination pupil; i.e., $x=k_x/(2\pi/\lambda)$, and $y=k_y/(2\pi/\lambda)$ ($k_x$ and $k_y$ being the components of the wave vector and $\lambda$ being the wavelength).

The inventors have discovered that quite generally, over different measurement conditions and measurement technologies, there are certain special points in the landscape, that can be determined experimentally or with the aid of simulations, where the signal contamination due to asymmetric process variations and the "ideal" signal that reflects overlay information, are completely decoupled and decorrelated (over the space spanned by another parameter, e.g., over the pupil), which results in special points in the landscape where the inaccuracy is zero. This occurrence is universal in the sense that at these points the inaccuracy associated with a variety of process variations (e.g., sidewall angle asymmetry or bottom tilt) becomes zero, roughly and in some instances, very accurately, at precisely the same point in the landscape. These observations apply to pupil overlay scatterometry, side-by-side pupil scatterometry, as well as imaging overlay metrology, with the differences being the major recipe parameters that determine the landscape major axis in these different cases. For example, in pupil overlay scatterometry the parameters are primarily the wavelength, the polarization, and the angle of incidence while in imaging overlay metrology the parameters are primarily the focus, the wavelength, the polarization, and the angle of incidence, any of which may be related to as being discrete or continuous, depending on specific settings.

The inventors have identified these points from data and simulations by observing the behavior of the first and the higher derivatives of the metrology performance on the landscape. For example, in pupil overlay scatterometry as a non-limiting example, defining the pupil variability VarOVL of the overlay, it may be shown that upon the use of particular pupil weights for the per-pixel information, the inaccuracy obeys Equation 1 at a certain wavelength $\lambda_R$:

$$\left(\frac{\partial VarOVL}{\partial \lambda}\right)_{\lambda=\lambda_R} = 0 \rightarrow \text{Inaccuracy}(\lambda=\lambda_R) = 0, \quad \text{Equation 1}$$

where the point(s) $\lambda_R$ at which the phenomenon exemplified in Equation 1 takes place would be referred to as resonance point(s), for the reasons explained below.

The inventors have further found out that the inaccuracy exhibits resonances (which may be expressed similarly to Equation 1) in other parameters as well, such as the angle of polarization at the entry or exit of the scatterometer, variation of the angle of polarization over the pupil, and/or any other continuous parameter that determines the tuning of hardware parameters and/or algorithmic parameters and/or the weighting of per-pixel/per eigenmode or principal component/per recipe information (which may be at the overlay or signal level).

Other type of examples involve replacing VarOVL by other metrics of the metrology like the sensitivity or any other signal characterizing metric mentioned in U.S. Patent Application No. 62/009,476, which is incorporated herein by reference in its entirety. The inventors have also discovered that Equation 1 takes place in the context of imaging overlay metrology upon replacing the scatterometer VarOVL on the pupil by quantities that measure the variability of the overlay results across the harmonics to which one can decompose the imaging signal, and by replacing the continuous wavelength parameter in Equation 1 by the imaging metrology focus.

The inventors stress that Equation 1 was found to be valid in both the minima and the maxima of VarOVL and its other realizations discussed above. Moreover, the inventors have related the physics that underlies Equation 1 at the minima and maxima, in the scatterometry context, to different types of interference phenomena (either in the signal or in the sensitivity) inside the film stack that separates the two gratings in the target cell (i.e., the intermediate film stack functions at least partly as an optical cavity with the gratings functioning as its (diffractive) mirrors). The inventors note that these interference phenomena may be seen as resembling Fabri-Perot resonances in the film stack. Specifically, the inventors have observed the phenomena in simulations, and have developed models that explain the behavior of the ideal signal and its contamination due to asymmetric process variations, to show that these Fabri-Perot-resonances-like interferences determine the dependence of the signals across pupil points which, in turn, causes the signals to be decorrelated from the process-variations-induced inaccuracy-causing contamination on the pupil and as a result to zero inaccuracy once the per-pixel information is weighted appropriately on the pupil. For example, such Fabri-Perot-like resonances reflect the fact that the phase difference between the electric field components carrying the information about the overlay of the bottom and top gratings is an integer multiple of $\pi$ ($\pi \times n$) for particular wavelengths and incidence angles. This phase difference is primarily controlled by the optical path difference separating the top and bottom gratings. This causes the appearance of special contours on the pupil signal where the overlay sensitivity is either zero or maximal (depending on the integer n), which indicates the resonance described and referred to above. With certain pupil averaging it may be shown that the inaccuracy is proportional to the correlation expressed in Equation 2 between the signal contamination due to asymmetric process variations and the per-pixel sensitivity:

Overlay inaccuracy in scatterometry~$\int d^2x(F(\text{Sensitivity}(\vec{x})) \times H(\text{Signal contamination}(\vec{x})))$  Equation 2 in which the integral is over the collection pupil coordinates. The inventors have discovered that when a Fabri-Perot-like resonance takes place, the integral in Equation 2 vanishes. For example, when a contour of zero sensitivity appears on the pupil the F(Sensitivity($\vec{x}$)) can be designed to cross zero whereas H(Signal contamination ($\vec{x}$)) does not, and this causes a cancellation of the per-pixel inaccuracy on the pupil to zero. This happens at wavelengths where there are maxima of VarOVL. A similar situation takes place at points where VarOVL is minimal and where "F(Sensitivity($\vec{x}$))" and "H(Signal contamination ($\vec{x}$))" switch roles (i.e., H(Signal contamination ($\vec{x}$)) crosses zero but F(Sensitivity($\vec{x}$)) does not), still causing the integral to vanish, since F(sensitivity(x)) is relatively flat, while the signal contamination is variable and hence Equation 2 vanishes to a good accuracy (see a demonstration in FIG. 3B below).

Figure 6C:
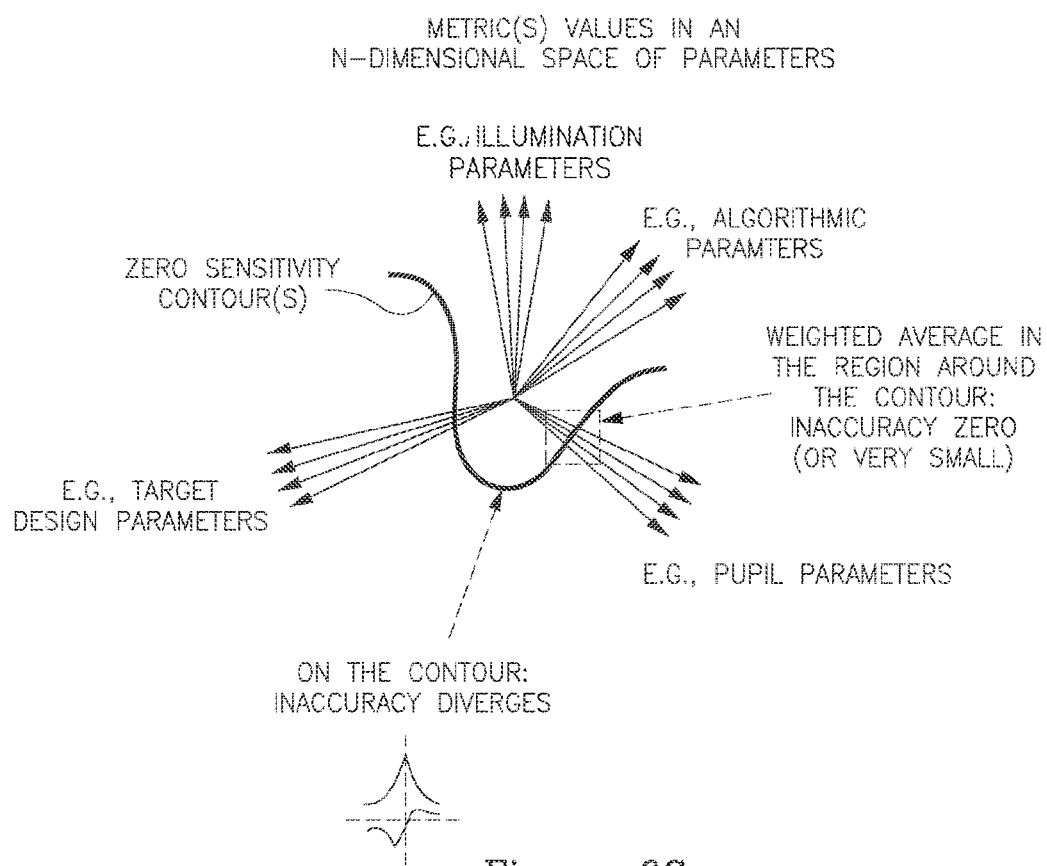
FIG. 6C is a high level schematic illustration of zero sensitivity contours and their utilization, according to some embodiments of the invention.

FIG. 6C is a high level schematic illustration of zero sensitivity contours and their utilization, according to some embodiments of the invention. FIG. 6C schematically illustrates an n dimensional space (illustrated by the multiple axes) of values of metric(s) with respect to various parameters, such as pupil parameters (e.g., pupil coordinates), illumination parameters (e.g., wavelengths, band widths, polarization, apodization, etc.), algorithmic parameters (e.g., methods of calculation and used statistics) and target design parameters (e.g., target structures, target configurations, layer parameters, etc.). It is noted that any of the parameters, may be discrete or continuous, depending on specific settings. A zero sensitivity contour is schematically illustrated, as exemplified in more details in FIGS. 1, 2A, 2B and 3A (see below). The inventors have discovered that while the inaccuracy on the zero sensitivity contour may be very large and even divergent, metric values derived from weighted averaging at a region around the zero sensitivity contour (illustrated schematically as a box) may be very small or even vanish. It is noted that the region over which the metric(s) is weightedly averaged may be defined with respect to any subset of the parameters (e.g., one or more pupil coordinate, and/or one or more illumination parameter and/or one or more target design parameter, etc.). This surprising result may be used to improve accuracy and measurement procedure, as exemplified by embodiments disclosed herein.

Figure 2A:
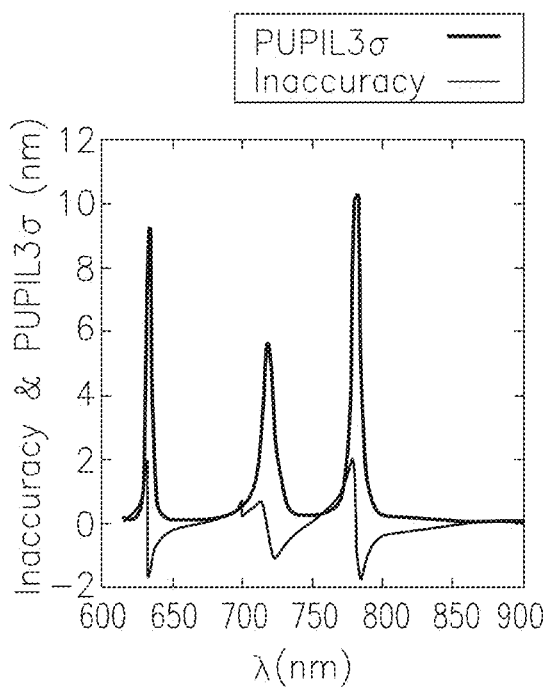
FIGS. 2A and 2B illustrate exemplary simulation results indicating the resonances, according to some embodiments of the invention.
Figure 2B:
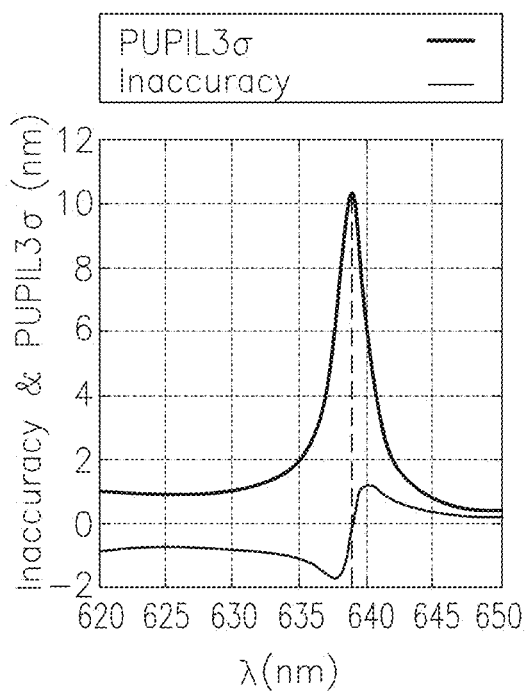

FIGS. 2A and 2B illustrate exemplary simulation results indicating the resonances, according to some embodiments of the invention. FIGS. 2A and 2B illustrate Pupil3S as $\sqrt{(\text{VarOVL})}$ and show that the inaccuracy vanishes at the extrema of VarOVL (indicated explicitly by the broken line in FIG. 2B). The specific asymmetry that was simulated is a "side-wall-angle" asymmetry type for different front end processes. The same phenomenon is observed for other asymmetry types.

Figure 3A:
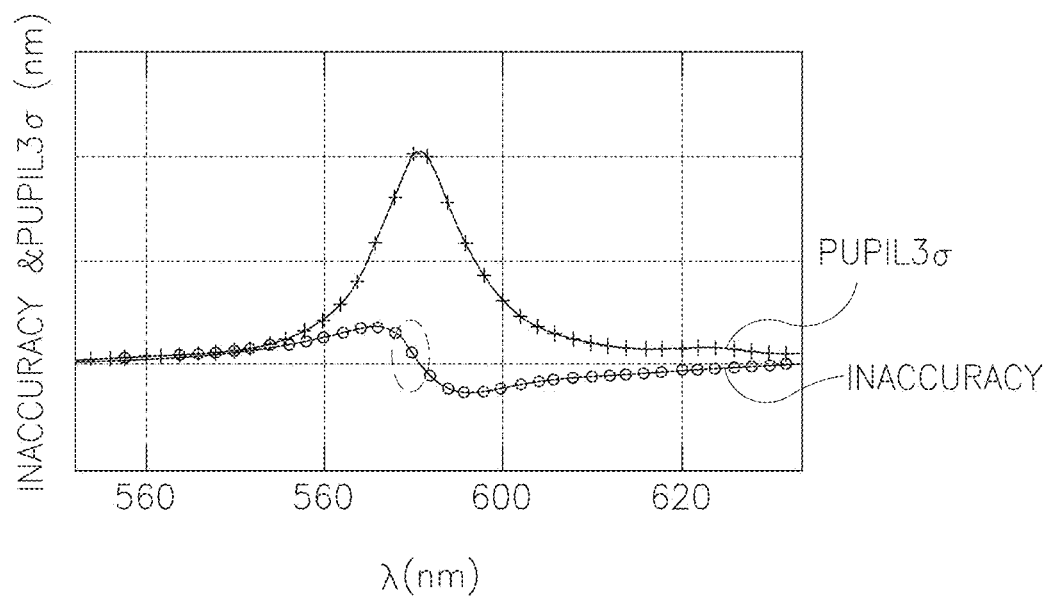
FIGS. 3A and 3B illustrate additional exemplary simulation results indicating the signals and inaccuracy, according to some embodiments of the invention.
Figure 3B:
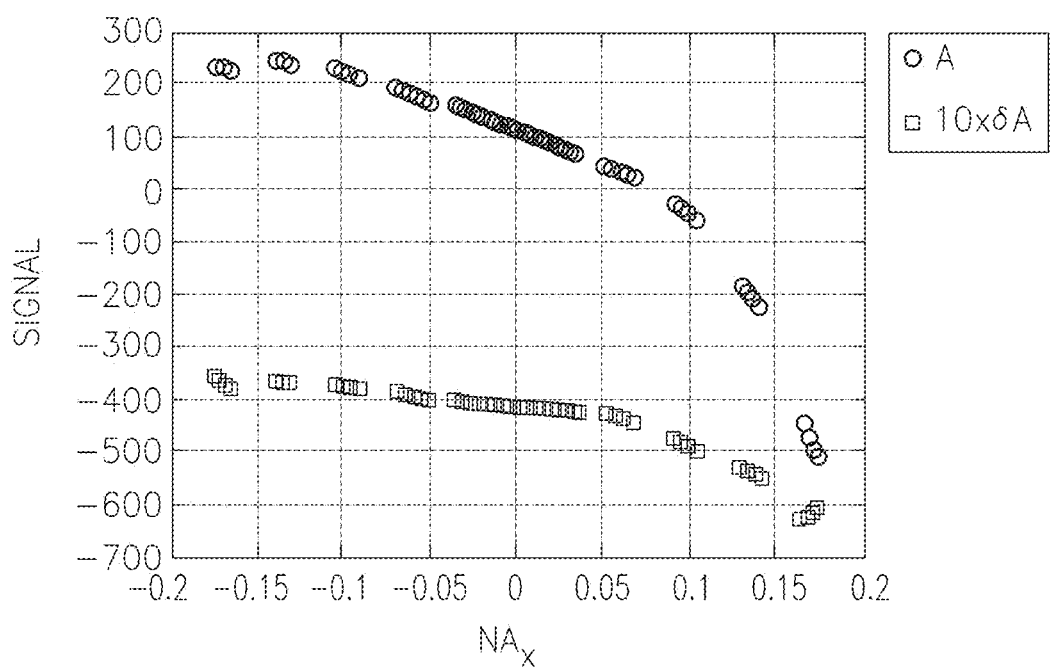

FIGS. 3A and 3B illustrate additional exemplary simulation results indicating the signals and inaccuracy, according to some embodiments of the invention. FIG. 3A illustrates the inaccuracy and Pupil3S in pupil scatterometry versus wavelength in front-end advanced processes (indicating vanishing of the inaccuracy at maximal variance, similar to FIGS. 2A, 2B). FIG. 3B illustrates the per-pixel ideal signal ($\lambda$) and signal contamination (10·$\delta$A), both for a cross section of the pupil signal from the middle band ($|y_{pupil}|<0.05$), where the y-axis is in arbitrary units. It is noted that in FIG. 3B the ideal signal ($\lambda$) crosses zero close to the resonance, while the signal contamination, termed $\delta$A, remains of the same sign.

In the following, the inaccuracy landscape is analyzed with respect to the symmetry of process variation effects. Overlay metrology technologies often measure the breaking of symmetry of a signal. Some imperfections due to process variations (PV) may induce asymmetry in the targets to be measured in addition to the asymmetry due to overlay. This leads to inaccuracies in the measurement of the overlay that may be critical when meeting the overlay metrology budget specifications required by the process. While the prior art methodology of overcoming those issues is to build a process robust target design that is to be measured with a specific recipe (wavelength, polarization and apodization) in train, certain embodiments of the present invention propose analytic and experimental approaches to identify points or lines in the inaccuracy landscape in which the inaccuracy is expected to vanish and in general understanding the landscape in order to characterize the sources of inaccuracy.

For example, a target comprising a grating-over-grating structure may be regarded as an optical device with specific properties, and a signature in the wavelength spectrum that defines its landscape. This landscape is sensitive to asymmetric process variations (PVs that break the symmetry inside the target such as cell to cell variations or intra-cell variations, grating asymmetry, etc.) as well as to symmetric process variations (PVs that do not break symmetry inside the same target, but that lead to variations between different targets such as different thickness, n&k variations of a layer between different targets, etc.). The different symmetric process variations across a wafer may lead to a shifting of the landscape in such a way that the measured target design may not be any more process robust at the edges of the wafer where important PVs (both symmetric and asymmetric) are to be expected in comparison with the center of the wafer. Inaccuracy arising from any of these factors, as well as by the target design itself that depends on duty cycles, pitch, etc., may be characterized by a signal having a unique signature in the wavelength spectrum. This signature, or landscape, can be revealed either by the sensitivity G and any pupil moment of the sensitivity and\or any monotonous function of the sensitivity, by the Pupil3S($\lambda$) (at the pupil plane) metric, or by other metrics. The landscape of the Pupil3S($\lambda$) can be grossly divided into two regions: regions of peaks where the inaccuracy behaves as $d\text{Pupil3S}(\lambda)/d\lambda$, and flat regions between the peaks as shown in FIG. 2A. Those different regions possess well-defined properties in the pupil that determine different accuracy behaviors.

The signature of a target may be defined by: the number and succession of peaks and flat regions; the distances between the peaks; and, the complexity of the peak that among other metrics is defined by the way it is transduced in the pupil image. The inventors note that different strengths of Pupil3S or of the inaccuracy do not define different landscapes (or target signatures) but different strengths of the same asymmetric process variation. This observation is referred to as "LS invariance".

Moreover, the inventors note that the process variations may be divided in two categories which, for the same targets would influence its landscape differently, namely symmetric process variations and asymmetric process variations.

Figure 4:
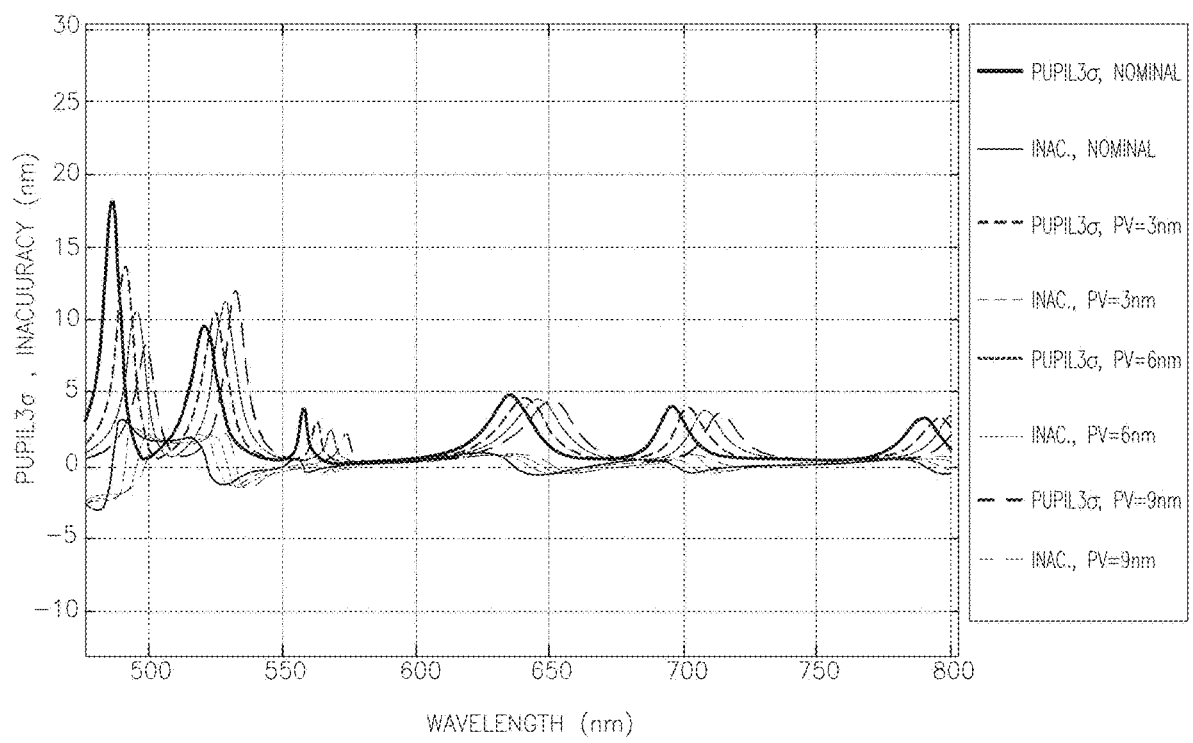
FIG. 4 is an exemplary illustration of simulation results depicting the shifting of a landscape describing a metrology metric's dependency on parameters, under symmetric process variation, according to some embodiments of the invention.

Symmetric process variations do not break the symmetry between the two cells of the same target and/or do not introduce any intra-cell asymmetry beyond the overlay and an induced offset. As an example, the thickness of one or more layers is varied in the target of a wafer's site relatively to the same target located in a different site. The optical path difference (OPD) between the scattered waves from those two different targets would lead to a global shift (up to a few tens of nanometers) of the landscape, keeping in first approximation the same properties defined here above. FIG. 4 is an exemplary illustration of simulation results depicting the shifting of the landscape under symmetric process variation, according to some embodiments of the invention. FIG. 4 illustrates that Pupil3S and the inaccuracy landscapes are merely shifted upon changing the magnitude of the symmetric process variation (PV, in the illustrated case a layer thickness variation) from 0 over 3 nm and 6 nm to 9 nm. The correspondence of Pupil3S and vanishing points of the inaccuracy illustrated in FIGS. 2A, 2B and 3A is maintained upon the shifting of the landscape and merely occurs at different wavelengths. It is also noted that process variation in the scale of several nanometers causes shifting of the landscape in the scale of tens of nanometers. The results for any given wavelength represent respective recipe results. It is further noted that process variation shifts the landscape from a flat region where the inaccuracy is low to a resonant region where the inaccuracy may be high, and may thus introduce a large inaccuracy into a recipe, which would be considered to have a low inaccuracy according to prior art considerations.

Asymmetric process variations are process variations which break the symmetry within the target. These may be divided in a non-limiting manner into different main categories, such as cell-to-cell variation, grating asymmetry, algorithmic inaccuracy, non-periodic process variation. Cell-to-cell variation represents a variation between the two cells of a target (e.g., thickness variation between two cells, different CD (critical dimension) between the cells, etc.), which may also shift the landscape proportionally to its strength but usually to a significantly lesser degree compared to symmetric PVs. The inaccuracy and the shift of the landscape due to cell-to-cell variation depend also on the overlay. Grating asymmetry is an asymmetry with the same period as the target's grating (e.g., SWA (side wall angle) asymmetry of a grating, asymmetric topographic variation, etc.), which in first approximation does not depend on the overlay. Algorithmic inaccuracy is due to a certain number of assumptions on the signal behavior, and its landscape behavior is the same as for asymmetric process variations. Non-periodic process variation breaks the periodicity in the target cells (e.g., diffraction from edges, light contamination by the surroundings due to the finite size of the cell, intra-cell process variation that induces grating profile change across the cell, etc.) and can be effectively considered as a combination of process variation mentioned previously.

These distinctions may be used in various ways to improve the accuracy of metrology measurements. For example, after mapping the expected process variations (e.g., in terms of the LS invariants) over the wafer (e.g., using measurement data or simulations) target designs over the wafer may be engineered to accommodate to the process variation by shifting the landscape in an appropriate direction with respect to the shift by the process variation (see FIG. 4). In another example, different targets in the different locations of the wafer may be classified in train and then compared in terms of the LS features. Certain embodiments comprise adjusting the wavelength of illumination (or other suitable physical or algorithmic parameters) over the different sites in order to remain at the same location of the landscape, i.e., compensate for process variation by corresponding optical (illumination) variation. In certain embodiments, certain regions of the landscape may be chosen to be measured with maximal accuracy, e.g., by adjusting the illumination wavelength or the illumination's spectral distribution or another physical or algorithmic parameter to optimize metrology accuracy as defined by a given metric. The inventors note that analyzing and using the understanding of the landscape enables to improve metrology resilience to the effects of process variation and optimize measurement recipes.

Certain embodiments comprise assigning and optimizing pixel weights to reduce inaccuracy according to derived landscapes. Assuming at least two overlay scatterometry measurements, one of a scatterometry cell having a designed offset F1 and another of a scatterometry cell having a designed offset F2. In the linear regime, the ideal scatterometry signal exhibits a pupil asymmetry, D, which is only due to the offsets (e.g., between the gratings in the grating-over-grating cell) and obeys D(x, y, OF)~OF, where the total offset of the cell, OF, equals F1+OVL and F2+OVL for the two scatterometry cells, respectively, and OVL denoting the overlay.

Using the fact that all the illumination pixels represent independent components of the electromagnetic response of the wafer, one can measure the overlay on a per-pixel basis. The per-pixel overlay is correspondingly denoted by OVL (x,y), (x,y) being the pixel coordinate. While, in the absence of target imperfection and noise, each pixel has the same overlay value, the sensitivity of different pixels to the overlay varies and can be approximated by the per-pixel difference between the differential signals on each of the two cells, $D_1(x, y)$ and $D_2(x, y)$. To obtain the final estimate of the overlay, the values obtained from the many individual pixels are averaged using optimized per-pixel weights to improve accuracy. The following explains the derivation of the per-pixel weights, which may be expressed analytically, and may be carried out by train or in simulations.

A specific sensitivity landscape may be derived and characterized, e.g., by identifying the following types of landscape regions: (i) Flat regions, having a flat pupil-per-pixel overlay dependency and thus a small derivative of the overlay with respect to respective variables, such as the illumination wavelength (as illustrated e.g., in FIG. 2A, between peaks). Flat regions are mostly also accurate. (ii) Resonance regions of the simple kind, which contain simple zero-sensitivity pupil contours and a simple peak in the pupil overlay variability across wavelengths, have zero crossings of the inaccuracy (as illustrated e.g., in FIG. 2B). The inventors note that between any two resonance regions (as defined in (ii)) that have the same parity, defined as $$\text{Parity(resonance)} \equiv \text{sign}\left[\frac{dOVL}{d\lambda}\right]_{\lambda=\lambda_R},$$

there is a "good" flat region, i.e., containing a zero crossing of the inaccuracy (as defined in (i)). Hence, integrating the overlay values along a flat region (i) between two same-parity resonance regions (ii) result in a very good estimate for the accurate overlay, i.e., the wavelength integral of the inaccuracy along an interval between the two same-parity resonance regions is very close to zero. Identifying these regions may be carried out by performing multiple measurements at multiple wavelengths to derive and improve per-pixel weights as well as for selecting the most accurate landscape regions. In certain embodiments, other illumination variables (e.g., polarization and apodization) may be used to characterize the inaccuracy landscape. This approach may be characterized as global in the sense that it analyzes the sensitivity behavior over a range of variable values to tune the pupil algorithms to point(s) with accurate reported overlay values as well as provide accuracy measures for any point in the variable value range.

This integration may be generalized to comprise a different weighted or a non-weighted integral over any continuous axis in the landscape, like the wavelength, and\or performing a fit of the signals of the form discussed in Equations 2-4, with generalizing the pupil coordinates (x,y) to a generalized set of coordinates including other parameters like the wavelength, polarization, target design, apodization, etc.

In addition to using the local properties of the landscape as described above, in certain embodiments more information is obtained by looking at properties of extended contiguous landscape regions and even at global features of the landscape. The known properties of a landscape (such as the sensitivity) in various sparsely dispersed points may be used in order to determine which regions of the landscape need denser sampling and which do not. Algorithms are provided herein, which determine the sampling density required for different regions of the landscape. The existence of resonance and/or peaks may be used to decide which regions have to be sampled at higher densities and for which a lower density suffices—to enable efficient measurements of the landscape of various metrics. Certain embodiments comprise adaptive algorithms that map the landscape by measuring as few points as possible. It is noted that the landscape must not even be partially continuous as long as the sampling is carried out appropriately, according to the principles disclosed herein.

The size(s) of the contiguous regions of the landscape that satisfy certain properties can serve as respective measure(s) to quantify the robustness of these regions to symmetric process variations. Examples for such properties comprise, e.g., a certain metrology metric being below or above a threshold; a size of the derivative of a metrology metric; or even the size of the derivative of the overlay with respect to the continuous parameters spanning the landscape, etc. A symmetric process robustness measure may be defined using relative sizes of peak regions and flat regions.

The relative signs of slopes of the landscape (e.g., of overlay or overlay variation values) at consecutive peaks (e.g., resonances) may be used to determine whether a respective intermediate flat region between the consecutive peaks is an accurate flat region. For example, the inventors have found out, that the number of sign flips of certain metrics (for example, the pupil-mean per-pixel sensitivity) is robust, almost invariant, to process variations and therefore can serve as means to make robust statements about the landscape. For example, in each simple resonance the sign of the pupil-mean per-pixel sensitivity changes. This can serve to detect whether a resonance is a double resonance rather than a simple one or whether a resonance has been missed by a sparse landscape-sampling algorithm. The inventors have used this information to detect the existence of resonances between measurement points located relatively far from the resonances. The peaks may be identified according to a number of sign flips of the metrology metric(s) and possibly characterized according to the number of sign flips of the metrology metric(s), e.g., as simple or complex peaks.

Certain metrology metrics whose inaccuracy has been determined to be oscillatory in flat or resonant regions of the landscape can be integrated over the respective region type in order to obtain the value to a good accuracy. The metrology metric(s) (e.g., an overlay) may be integrated over one or more specified landscape region to enhance measurement accuracy.

In certain embodiments, the correlation of certain metrology metrics in different, possibly far apart, regions of the landscape across sites on the wafer or over other parameter(s) is used to predict the degree of independency among the metrics, that is whether they behave differently under both symmetric and asymmetric process variations. Certain embodiments utilize independent regions that are inferred thereby to assess the validity of metrology metrics or the overlay measured on them.

Certain embodiments comprise more specific approaches in the sense that a full analysis of the landscape is not required. For example, the per-pupil-pixel overlay values may be averaged by optimizing the number and position and weights of the pupil pixels to find maxima and minima of the variability of the per-pupil-pixel overlay values. For instance, to enable the optimization, zero sensitivity contour lines in the pupil may be detected and region(s) of interest (ROI) in the pupil may be defined in a certain way with respect to these lines, to achieve a maximum and to avoid obtaining a minimum. It is noted that the regions holding the pixels for averaging may or may not form connected components on the pupil. If they are not connected, their locations may be determined by the values of the sensitivity per-pixel and its sign which may be detected on the fly (e.g., during run time) by observing the difference between the measured differential signals. In certain embodiments, pixel choice may be optimized by defining an optimization cost function as a monotonously decreasing function of the average sensitivity and/or as a monotonously increasing even function of the per-pixel sensitivity over the pupil. Simulations and theory show that both methodologies may be successful in different portions of the landscape since the inaccuracy tends to cancel among pixels whose sensitivity have an opposite sign, the optimal cancellation being often indicated by the extremum of the per-pixel variability and/or the cost function. It is noted the choosing the pixels to be averaged may be carried out in run or in train and by algorithms or hardware (as per the light transmission modulators discussed in U.S. Pat. Nos. 7,528,941 and 8,681,413 and in U.S. patent application Ser. Nos. 13/774,025 and 13/945,352, which are incorporated herein by reference in their entirety). In the latter case, the optimizations may also be carried out in field overlay scatterometry.

Certain embodiments comprise allocating pupil weights geometrically by binning the signal and/or overlay value of physically motivated groups of pixels (like those with a common x-component of the incident k-vector) and then averaging these bins non-uniformly to compensate for the mismatch between the illumination pupil transmission function (determined by the choice of the illumination pupil geometry and/or amplitude transmission) on one hand, and the distribution of the OVL information content over the physical pupil on the other hand. As a non-limiting example, in many cases of the grating-over-grating SCOL target, the OVL information changes over the pupil primarily in the direction of the grating periodicity. Certain embodiments comprise properly chosen geometric weight(s) to accommodate for this.

Certain embodiments comprise accuracy improvement algorithms which interpolate and/or extrapolate the landscape (signals and per-pixel overlay values) with respect to two or more measurement points, to generate a continuous artificial signal that depends on continuous parameter(s) that control the way the new signal is connected to the collected raw signals. Then, the continuous space of parameters may be explored as a landscape of a corresponding pre-chosen cost function, which may be optimized with respect to the interpolating/extrapolating parameters. Then, the optimization point defines an artificial signal, from which the accurate overlay is computed. Optimization functions may be composed of any metric relating to the artificial signal such as its averaged sensitivity, the sensitivity's root mean squared (RMS), the overlay pupil variability, the estimated precision of the overlay (as per a noise model of the tool) and other pupil flags discussed in U.S. Patent Application No. 62/009,476, which is incorporated herein by reference in its entirety, and/or their respective inverse metrics. In the context of imaging overlay metrology, a similar methodology may be applied, with the replacement of the optimized functions by the overlay variability across the harmonics, and/or the image contrast, and/or the estimated precision of the measurements. The ultimate overlay which these algorithms report is the overlay of the approximated artificial signal which corresponds to the overlay on a special point in the landscape or generalization thereof, which was not actually measured but is accurate.

Moreover, in certain embodiments, the landscape may comprise a more complex signal derived from two or more measurements, such as a parametric landscape which combines multiple measurements that may be weighted or tuned by using one or more parameters, or a multidimensional signal having contributions from different measurements at different dimensions of the signal, as two non-limiting examples. The multiple measurements may be raw or processed measurements, in the pupil plane and/or in the field plane with respect to the target. In case of parametric landscapes, parameter(s) may be adjusted to (i) yield landscapes with specified characteristics, such as number, positions and characteristics of resonance peaks, (ii) optimize the parametric landscape with respect to specified metrics, and/or (iii) enhance the accuracy of the overlay measurements. The adjustment may utilize phenomenological model(s). The landscape may be seen as an artificial signal that is computed by combining multiple raw signals and/or processed signals (either in the pupil-plane or in the field-plane), possibly according to specified parameters. The generated artificial signal may be modified by changing the parameters. The artificial signal may be optimized according to certain metrics and used to make an accurate overlay measurement. The raw signals (either in pupil-plan or in field-plane) and/or the artificial signal may be fitted to phenomenological models to obtain the overlay and other metrology metrics, which serve as the fit parameters. For example, by using a phenomenological model of the deviation of the signal from the ideal one, the measured signal can be fitted to the model. In the fitting, the fit parameters may comprise the overlay and the parameters describing the deviation from the ideal signal, and the accurate overlay and the deviation of the signal from the ideal one may be obtained from the fitting.

Certain embodiments comprise accuracy improvement algorithms that treat a single signal in different ways that are all controlled by a change in one or few parameters. For example, the per-pixel weight may be changed in a continuous way and, while making it always a continuously increasing function of the per-pixel sensitivity, let the N parameters which define this function span a space $V \subset R^N$ and let the origin in this space be a special point to which one extrapolates (but in which one cannot measure due to tool issues). For example, that point may correspond to a point where only the most sensitive pixel in the image determines the OVL. The methodology described here is to extrapolate to the origin of V, and report the result of the overlay to be the overlay at that extrapolated point—e.g., when measuring the overlay with a pupil sampling that is centered around the point in the pupil that has a maximal sensitivity, and relating to the radius R that as a variable parameter—the expression $OVL(R)=A+B \times R+C \times R^2+ \ldots$ may be calculated and fitted to the results, and then extrapolated to R=0, which means one quotes the new overlay to be equal to "A".

Certain embodiments comprise accuracy improvement algorithms which perform fits of the data to models inspired by underlying physical models and/or simulation results of the measured layers and/or layers whose properties are similar. At least one measurement of at least one metrology metric may be carried out, by simulation or in preparatory measurements, using at least one recipe parameter. Then, the at least one measurement may be fitted to a phenomenological model that describes a dependency of the at least one metrology metric (in a non-limiting example, an overlay) on the at least one recipe parameter (see examples below), and from the fitting, at least one respective corrected metrology metric may be derived and used to determine a metrology recipe and to conduct metrology measurements according to the determined recipe. The at least one measurement may comprise an at least partially continuous dependency of the at least one metrology metric on the at least one recipe parameter such as the landscape, but may also comprise single or discrete measurements. As described above, the model predicts how the non-ideal signal should look as a function of the overlay and other parameters describing the factors leading to the inaccuracy, and by fitting the overlay as well as the parameters governing the inaccuracy may be derived from the measurement(s).

In certain embodiments, the phenomenological model may describe a dependency of a signal type (such as specified pupil plane measurements, e.g., a pupil image, or specified field plane measurements) on the at least one metrology metric and on at least one deviation factor such as various factors that contribute to inaccuracies that may relate to recipe parameters. After carrying out at least one measurement related to a signal type, the phenomenological model may be used to fit the at least one measurement in order to derive at least one respective corrected metrology metric (e.g., a corrected overlay) and the corresponding deviation factor(s).

In certain embodiments, a metrology recipe may be determined according to the at least one derived corrected metrology metric, and at least one (additional) metrology measurement may be conducted according to the determined recipe.

The phenomenological model may be derived from an at least partially continuous dependency of the at least one metrology metric on the at least one recipe parameter that is derived by simulation or in preparatory measurements (e.g., any of the disclosed landscapes).

Figure 5:
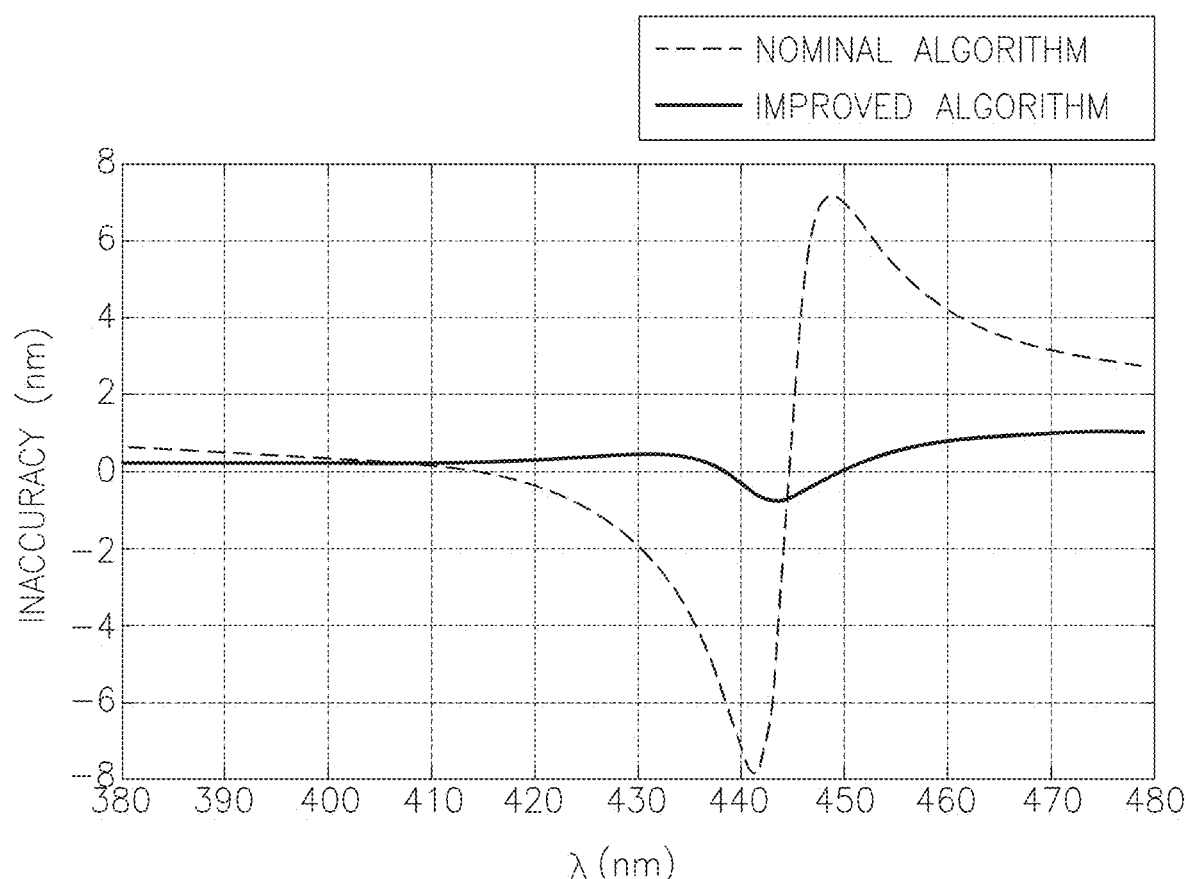
FIG. 5 illustrates simulation results of an exemplary accuracy enhancing algorithm, according to some embodiments of the invention.

For example, a fit of the differential signals may be performed to the form $$D(x,y,OF)=A(x,y) \times OF+H(x,y;P_1,P_2,P_3, \ldots ) \times F(OF) \quad \text{Equation 3}$$

with F(OF) being a function of the offset OF and H(x, y; $P_1$, $P_2$, $P_3$, . . . ) being a function of the pupil coordinates (x, y) and the fitted parameters $P_i$, in a linear space V of functions describing the measured attributes like the per-pixel sensitivity, derivatives of the per-pixel sensitivity along the landscape (for example, along variables such as polarization, angle, wavelength, possibly based on simulations and/or additional signal measurements along the landscape), and pupil moments of the per-pixel sensitivity (e.g., pupil average, pupil RMS, etc.). The functions which are included in the space V may be determined from simulations and/or further research. For example, the inventors have discovered that if the space V contains the above examples, then the inaccuracy in certain layers in the front-end process is greatly improved as demonstrated in FIG. 5. FIG. 5 illustrates simulation results of an exemplary accuracy enhancing algorithm, according to some embodiments of the invention. FIG. 5 illustrates the inaccuracy in a front end layer of an advanced process with and without the fit-improving algorithms.

The fit demonstrated in FIG. 5 is carried out using a cost function which is generally an increasing function of the distance between the model for the signals, and their corresponding data. The norm (in the mathematical sense) for defining the cost function may be determined per use case, in non-limiting examples, $L_2$ (Euclidean norm), $L_1$ and/or $L_\infty$ (Maximum norm). The cost function may generally be an average across the pixels and may be calculated with a uniform weight or with any of the per-pixel weights described above. In particular, the weights may be composed of the functions forming a basis of the space V, defined after below. To avoid situations where the cost function has flat directions that are unrelated to the fit parameter of interest (which is the OVL and that is encoded in the offset of the cell $OF_{cell}=((\text{designed offset})_{cell}+OVL))$, one can use the singular value decomposition or perform various such fits and, for each one, calculate the fit fidelity which is a monotonously increasing function of the fit's stability and of the estimate of the expected precision (given the metrology tool's noise model). The fit stability may be determined by a monotonously increasing function of the variance of the fit parameter as per the usual least squares method. Then, the final result for the OVL is the mean of the calculated fits and weighted according to the fit fidelities. The fits may be carried out in the space of the actual signals, or of any useful transformation thereof. For example, one may fit $D_{cell}(x, y)$ to be linear $OF_{cell}$ plus a term linear in $H(x, y) \times F(OF)$ and/or one may fit $$\frac{D_{cell}(x, y)}{OF_{cell}}$$

to be cell independent plus a term linear in $$H(x, y) \times \frac{F(OF)}{OF}.$$

In certain embodiments, any one or more parameters, and specifically not necessarily or not exclusively pupil coordinates may be used for the analysis, e.g., illumination parameters and/or target design parameter, may replace x and/or y in Equations 2-4. $\vec{x}$ and (x,y) in these equations may be replaced with a set of degrees of freedom which may be continuous and\or discrete with respect to each of the parameters and include parameters such as wavelength, polarization, apodization, other parameters of the measurement recipe and parameters of the target design.

Advantageously, algorithmic and hardware improvements are achieved, as well as better target designs, which improve the overlay accuracy performance. Moreover, metrology is made more resilient to the effects of process variation on the landscape, either by using different target designs, and/or different metrology recipes and/or the disclosed algorithms.

Certain embodiments provide methods of deriving the ground truth of the overlay from the accuracy signature of the stack by using the way the inaccuracy changes across the spaces of tool recipes, turning optical overlay into an effective accuracy ruler. Certain embodiments enable using different target designs with the same recipe, or using different recipes with the same target design across the wafer in train, or using combinations of targets and recipes, utilizing the knowledge of the sensitivity landscape and respective overlay behavior.

Certain embodiments provide methods that use the pupil signals and, more specifically, the contours of zero overlay sensitivity in the pupil (and in the general parameter space in the case of non-scatterometry techniques), to design algorithms that improve the overall metrology sensitivity to overlay, the accuracy of the overlay results, and the process robustness.

Certain embodiments provide methods of characterizing overlay metrology accuracy as a function of illumination wavelength or illumination spectral distribution by simulating metrology accuracy or pupil characteristics as a continuous or densely sampled function of wavelength.

Certain embodiments provide methods of selecting metrology recipes by simulating overlay metrology accuracy or pupil characteristics as a continuous or densely sampled function of wavelength.

Certain embodiments provide methods of overlay metrology target design by simulating metrology accuracy or pupil characteristics as a continuous or densely sampled function of wavelength.

Certain embodiments provide methods of recipe selection or optimization by simulating metrology accuracy or pupil characteristics as a continuous or densely sampled function of wavelength.

Certain embodiments comprise multiple scattering models that describe parts of the landscape and especially low in accuracy regions in the landscape, which may be used to identify these landscape features and implemented in respective algorithms and metrology methodologies, as well as to select measurement parameters which provide low inaccuracy as explained above. The models presented below were verified by simulation results. For example, in a non-limiting example, with parameters that correspond to logic 14 nm node, a contour at the pupil center at $\lambda_R$=477 nm may be used to suggest the illumination wavelength that yields low inaccuracy. In a comparison of the results from the simple analytic model with complete RCWA (rigorous coupled-wave analysis) simulations, the latter suggest $\lambda$=500 nm as the low inaccuracy illumination wavelength, which is in close agreement to the result from the single-scattering model The inventors have investigated the effect of the bandwidth of the illumination light and discovered that, for pupil overlay scatterometry, one can use the illumination bandwidth as an additional hardware parameter to control the landscape, change the landscape derivatives of the signal characteristics (e.g., of the overlay variance), and smooth the sensitivity if needed.

In the imaging context this behavior is related to the way the correlation between the signal contamination and the ideal signal vanishes at certain focus slices and the equations describing this remain the same as Equation 2 above (with the appropriate mapping of parameters).

Certain embodiments may utilize these results by tuning the hardware to the resonant point using the metrics mentioned above and changing the hardware parameters that determine the proximity to the resonant point (like wavelength, polarization, quarter wave plate orientation, focus, etc.).

Certain embodiments comprise measuring at different values of the hardware parameters that determine the proximity to the resonance and extrapolating or interpolating the overlay value and the optimizing metric (e.g. VarOVL or the sensitivity) to the resonant point.

Generating new signals from linear combinations of signals at different values of the hardware parameters, measurement pixels or principal components of pupil signals. The linear combinations are governed by algorithmic parameters and finding the best algorithmic parameters which finds extrema of the metrics mentioned above. The inventors discovered that when the algorithmic parameters equal a value where the optimized metrics have extrema, one can determine whether the inaccuracy is small compared to its value derived from the original signals by comparing the values of the optimized quantities before and after the algorithmic tuning.

Certain embodiments use the differentials of the signal characteristics (like VarOVL and the sensitivity) to distinguish between different regions in the landscape as explained above and according to the gradients on the landscape (left side of Equation 1) and to identify useful regions in the landscape for application of the disclosed methods. For example, the inventors discovered that the value of VarOVL itself, the OVL derivative with respect to the hardware parameters, and the derivative of VarOVL with respect to the hardware parameters are good indices for partitioning the landscape. The disclosed methodologies may be applied at run time for recipe optimization, and also to compensate for landscape shifts on the fly, e.g., due to symmetric process variations. The resonance points in the landscape are especially valuable indicators as they allow effective tuning on the fly. The inventors have further discovered that the above phenomena become especially robust when the overlay mark is constructed from a single layer of films (lacking bulk material between the bottom grating and the silicon substrate). Metrology targets may hence be designed to minimize the electromagnetic penetration to below the bottom grating by using, e.g., dummifications (small scale structures) and segmentations of metallic depositions below and/or within the bottom grating of the target.

The inventors have discovered that the in the presence of the Fabri-Perot-like phenomenon the following relations, expressed in Equations 4, 5, may hold.

$$\frac{\partial D(\text{Sensitivity}(x))}{\partial \lambda} = c(\lambda) \times G(\text{Signal contamination}(\vec{x})) \quad \text{Equation 4}$$

$$\frac{\partial E(\text{Signal contamination}(x))}{\partial \lambda} = b(\lambda) \times F(\text{Sensitivity}(\vec{x})) \quad \text{Equation 5}$$

where $c(\lambda)$ and $b(\lambda)$ are scalars and $D(x)$, $E(x)$, $F(x)$ and $G(x)$ are some known functions, for example $F(x)=x^3$. In certain embodiments, Equation 4 may be used to provide a per-pixel estimation of the signal contamination from data, by fitting the experimental VarOVL into the estimate of VarOVL based on Equation 4. Since many of the zero-inaccuracy resonances have their landscape determined by the way the nominal stack and target design behave rather than by the asymmetric process variations, certain embodiments provide target designs that produce landscapes that contain such zero crossings of the inaccuracy and that are easily identifiable by extrema of VarOVL (e.g., by tuning the target parameters to control the LS shift along the relevant parameter axis). In a non-limiting example, one can move resonances in the LS by addition of half pitch to the induced offset.

Certain embodiments comprise the following methodology of separating process variations from overlay. Given the per-pixel differential signals $D_1(\text{pxl})$ and $D_2(\text{pxl})$, the following x and y may be defined as:

$$x \equiv \frac{D_1 - D_2}{2f_0} \text{ and } y \equiv \frac{D_1 + D_2}{2f_0}.$$

The signal contamination of different sorts (like bar asymmetry or a film thickness change from pad 1 to pad 2 of the target) enters the signals as expressed in Equations 6:

$$x_{ideal} \rightarrow x_{ideal}(pxl) + \sum_m \Delta P_m \times f_{x,m}(pxl) \quad \text{Equations 6}$$
$$y_{ideal} \rightarrow y_{ideal}(pxl) + \sum_m \Delta P_m \times f_{y,m}(pxl)$$

with $\Delta P_m$ being the pixel-independent magnitude of the process variations from the nominal (ideal) stack, and $f_{x,m}$, $f_{y,m}$ are the corresponding pupil dependencies of how that process variation affects x and y, which may be deduced, e.g., from simulations. Then, by optimizing, per site, the cost function of Equation 7, $$\chi^2 = \langle ((x - \Sigma_m \Delta P_m \times f_{x,m}(pxl)) - \in \times (y - \Sigma_m \Delta P_m \times f_{y,m}(pxl)))^2 \rangle \quad \text{Equation 7}$$

where $\in \equiv \text{OVL}/f_0$, the parameters E and $\Delta P_m$ may be extracted from the fit.

Advantageously, certain embodiments allow tuning to zero inaccuracy points in the landscape on the fly and in train and provide process robust methods that do not break down in the presence of process variations and do not necessarily require simulations for recipe optimizations or a large effort for recipe optimization. Disclosed methods are applicable to imaging, scatterometry and/or µDBO (µDBO—micro diffraction based overlay, as described in U.S. Pat. No. 8,411,287).

FIG. 11 is a high level flowchart illustrating a method 100, according to some embodiments of the invention. Method 100 may be at least partially implemented by at least one computer processor, e.g., in a metrology module. Certain embodiments comprise computer program products comprising a computer readable storage medium having a computer readable program embodied therewith and configured to carry out of the relevant stages of method 100. Certain embodiments comprise target design files of respective targets designed by embodiments of method 100.

Method 100 may comprise deriving and analyzing an at least partially continuous dependency of one or more metrology metric on one or more recipe parameter (stage 105) and determining one or more metrology recipe according to the analyzed at least partially continuous dependency (stage 128). Method 100 may comprise selecting at least one parameter value for conducting at least one metrology measurement (e.g., an overlay measurement) according to at least one identified extremum (stage 130) in a dependency of at least one metrology metric (e.g., an overlay variation measure) on at least one respective parameter of the measurement; and conducting the metrology measurement(s) with the selected parameter values(s) (stage 350). Method 100 may further comprise deriving the dependency (e.g., discrete points, a landscape and/or continuous function(s), any of which possibly multidimensional) by simulation or in preparatory measurements (stage 110), e.g., by deriving or measuring a dependency of one or more metrology metric(s) on one or more measurement parameter (s). Method 100 may further comprise identifying extrema in the dependency or in the landscape (stage 120), e.g., analytically by nullifying a derivative of a functional dependency of the metric(s) with respect to the parameter(s) (stage 122), or experimentally according to measurements and/or simulation results (stage 124). In certain embodiments, method 100 may comprise carrying out identification 120 on the fly, e.g., prior to the measurements (stage 126). In certain embodiments, method 100 may comprise adjusting parameters such as measurement parameters according to the identified extrema, possibly on the fly (stage 132).

In certain embodiments, method 100 may further comprise identifying and categorizing regions in the landscape or generally in the derived or measured dependency. Method 100 may comprise characterizing the sensitivity landscape by distinguishing flat regions from peaks (stage 170) and/or quantifying the magnitude of sensitivity changes with respect to measurement parameters according to respective landscapes (stage 171).

Method 100 may further comprise using relative signs of slopes of the landscape at consecutive peaks (e.g., resonances) to determine whether a respective intermediate flat region between the consecutive peaks is an accurate flat region (stage 172). Method 100 may comprise determining a required sampling density for different regions of the landscape according to peak locations in the landscape (stage 173). For example, method 100 may comprise sampling the landscape at a high density at peak regions and at a low density at flat regions (stage 174).

Method 100 may comprise measuring a symmetric process robustness using relative sizes of peak regions and flat regions (stage 175).

Method 100 may comprise identifying the peaks according to a number of sign flips of the metrology metric(s) (stage 176) and optionally characterizing the identified peaks according to the number of sign flips of the metrology metric(s) as simple or complex peaks (stage 177).

Method 100 may further comprise integrating the metrology metric(s) over landscape region(s) (stage 178) and possibly correlating multiple metrology metrics over specified landscape regions to validate the metrology measurement(s) (stage 179).

Method 100 may comprise any of identifying points and/or contours of zero sensitivity in the landscape (stage 160), identifying resonances in the intermediate film stack between (especially layered) target structures (stage 162) and using single or multiple scattering models to identify the points and/or contours of zero sensitivity in the landscape (stage 164). Method 100 may comprise identifying the points or contours and adjusting parameters respectively on the fly (stage 165), e.g., shortly prior to consecutive measurements.

Method 100 may further comprise binning signals from portions of the pupil or with respect to specified parameters (e.g., measurement recipe parameters) according to the identified points and/or contours of zero sensitivity in the landscape (stage 166). Method 100 may further comprise selecting an illumination wavelength and/or spectral distribution for which the inaccuracy vanishes (stage 168).

In certain embodiments, the overlay metrology measurement may be of a grating-over-grating scatterometry target or a side-by-side scatterometry target and the at least one parameter may be related to an optical path difference between the gratings and comprise at least one of: a thickness of intermediate layers between the gratings, a measurement wavelength, an angle of incidence, an angle of reflectance, polarization properties of incident and reflected light, target geometric parameters and electromagnetic characteristics of the gratings and of intermediate layers between the gratings. In certain embodiments, the at least one parameter may comprise at least one of: the measurement wavelength, the polarization of incident and/or reflected light, and the angle of incidence and/or reflection.

In certain embodiments, the overlay metrology measurement may be of an imaging target and the at least one parameter may be related to an optical path difference between target structures and comprise at least one of: a thickness of intermediate layers between the target structures, a measurement wavelength, an angle of incidence, an angle of reflectance, polarization properties of incident and reflected light, target geometric parameters, electromagnetic characteristics of the target structures and of intermediate layers between the target structures, and measurement tool focus. In certain embodiments, the at least one parameter may comprise at least one of: the measurement tool focus, the measurement wavelength, the polarization of incident and/or reflected light, and the angle of incidence and/or reflection.

In certain embodiments, method 100 may comprise applying one or more weight function(s) for averaging the metric(s) across the pupil pixels to achieve low inaccuracy (stage 150). For example, method 100 may comprise determining the weight function(s) with respect to the landscape (stage 152) (e.g., the sensitivity landscape). Method 100 may further comprise calculating the overlay or other metrics according to the weight function across the pupil (stage 154).

Method 100 may further comprise separating asymmetric process variation from symmetric process variation by simulating or measuring an effect thereof on the derived dependency (stage 140). Certain embodiments comprise quantifying landscape shifts caused by symmetric process variation (stage 190) and selecting measurement settings according to expected landscape shifts (stage 192). For example, method 100 may comprise selecting the measurement settings to exhibit low sensitivity to expected landscape shifts (stage 194), cancelling out expected landscape shifts by corresponding target or measurement designs which cause an opposite shift of the landscape (stage 196), fitting measurement parameters to different target sites according to the expected landscape shifts in the respective sites (stage 198) and/or selecting an illumination wavelength and/or spectral distribution (e.g., bandwidth) according to the expected landscape shifts (stage 200).

Method 100 may comprise deriving the landscape as a parametric landscape, using one or more measurements, with respect to one or more parameter(s) (stage 180) and possibly adjusting the parameter(s) (e.g., using phenomenological model(s)) to optimize the parametric landscape with respect to specified metrics and/or to enhance overlay measurement accuracy (stage 182).

In certain embodiments, method 100 may comprise interpolating or extrapolating a continuous artificial signal landscape from discrete measurements or data (stage 184), constructing the continuous artificial signal landscape by fitting discrete measurements or data to an underlying physical model (stage 186) and applying cost function(s) to the artificial signal landscape (stage 188).

Method 100 may further comprise optimizing the metrology recipe and/or the hardware settings to achieve low inaccuracy according to the landscape (stage 210) (e.g., the sensitivity landscape) and/or tuning hardware parameter(s) to points and/or contours of zero sensitivity in the landscape (stage 212).

In certain embodiments, method 100 may comprise estimating per-pixel signal contamination by comparing estimation and measurement data of metric(s) (stage 220).

Method 100 may further comprise designing metrology targets to yield low inaccuracy (stage 230), for example, designing the metrology targets according to the simulated landscape (stage 232) (e.g., a simulated sensitivity landscape). In certain embodiments, method 100 may comprise configuring the intermediate film stacks to yield resonances at specified measurement parameters (stage 234) and/or minimizing electromagnetic penetration below or at the target's lower structure (stage 240), e.g., by designing the targets to have dummy-fill or segmentation at or below their lower layer (stage 242).

Method 100 may further comprise measuring overlay and other metrology results around low or zero inaccuracy points or contours (stage 360), performing metrology measurements at flat regions of the sensitivity landscape (stage 362) and/or performing metrology measurements of the design targets (stage 364). Additional steps of method 100 are explained below.

In the following, methods and fidelity metrics are provided which relate to measured diffraction signals, comprising at least ±first diffraction orders at a pupil plane of a metrology tool, and derived from a target comprising at least two cells, each having at least two periodic structures having opposite designed offsets. Overlays of the target are calculated, from the measured diffraction signals of the cells, using differences between signal intensities of opposing orders measured at pupil pixels which are rotated by 180 with respect to each other, at each cell. Fidelity metrics may be derived from estimated fits between pupil functions, by integrating differential signals across the pupil, and by quantifying various asymmetries across the pupil. The fidelity metrics may be applied in preparatory stages to optimize the metrology recipe and during running time to indicate occurring production errors.

Fidelity quantitative merits for scatterometry overlay metrology are presented, involving mathematical methods and statistical means. The fidelity metrics may have nanometer units to quantify the inaccuracy-related uncertainty of the measurement and allow optimal choice of recipe and target setup, flag inaccuracy issues in run, and enhanced accuracy.

The inventors have found out that the introduced fidelity metrics are superior to prior art TMU (total measurement uncertainty) metrics which quantify repeatability estimates ('precision') and tool asymmetry contributions ('tool induced shift').

Figure 7A:
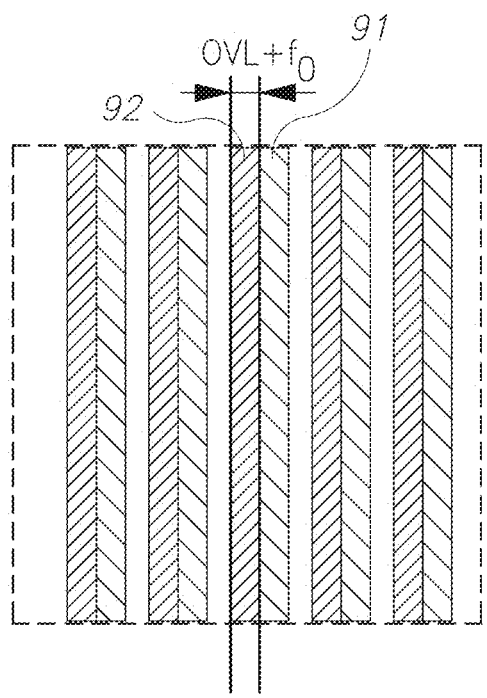
FIGS. 7A and 7B schematically illustrate target cells, having two periodic structures such as parallel gratings at different layers with intermediate layers, printed in a lithography semiconductor process, according to some embodiments of the invention.
Figure 7B:
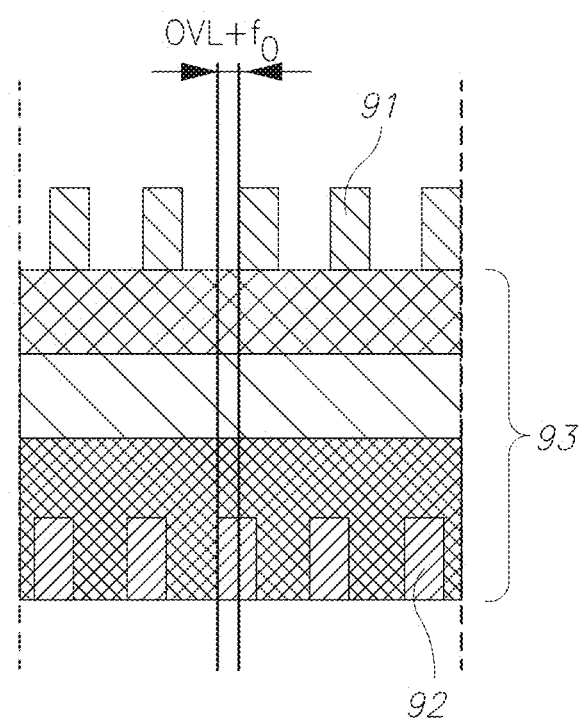
Figure 8:
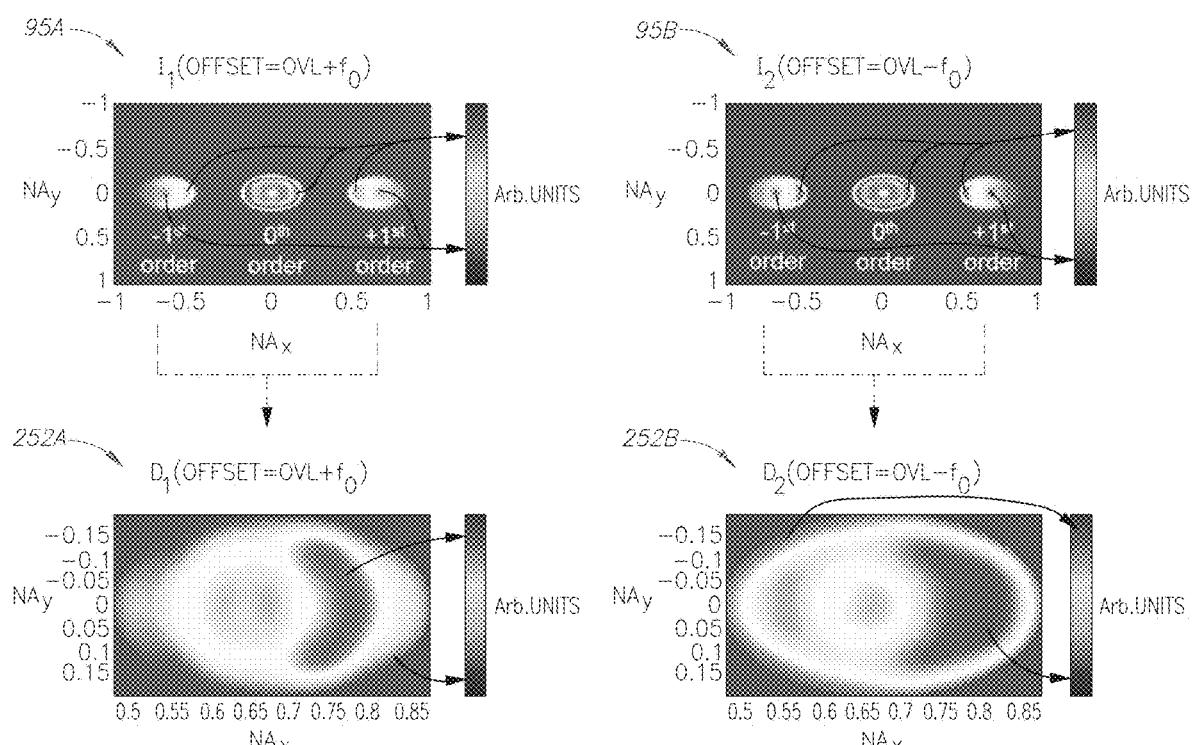
FIG. 8 schematically illustrates pupil signals and differential signals of two cells with opposite offsets, according to some embodiments of the invention.

The presented metrics are applicable to scatterometry overlay targets and measurement procedures and recipes. Exemplary targets comprise two or more cells per overlay direction (e.g., x direction, y direction). FIGS. 7A and 7B schematically illustrate target cells 90, having two periodic structures such as parallel gratings 91, 92 at different layers with intermediate layers 93, printed in a lithography semiconductor process, according to some embodiments of the invention. FIG. 7A is a top view while FIG. 7B is a cross sectional side view. The overlay, offset or combined overlay and offset are indicated as OVL in FIGS. 7A and 7B. It is noted that cells may have multiple periodic structures, and that the periodic structures may be located at a single physical layer (produced e.g., by multiple patterning steps and termed then a side-by-side target cell). Cells are commonly order pairwise, each cell of a pair having opposite designed (induced) offsets, denoted $\pm f_0$, each offset is between the upper periodic structure (usually called current layer) and the lower periodic structure (previous layer). One cell of a pair holds a $+f_0$ nanometers offset and the other cell a $-f_0$ nanometers offset. In the non-limiting example presented below, it is assumed that the target comprises four cells, and similar procedure may be applied to any scatterometry overlay target. It is further noted, that the metrics relate to target measurements at the pupil plane of the optical system of the metrology tool. Diffraction signals of the cells are measured and the following differences between signal intensities of opposing diffraction orders (e.g., +1 and −1 diffraction orders) are measured at pupil pixels which are rotated by 180° with respect to each other, at each cell. These differences are termed "the differential signal" and are illustrated in FIG. 8, which schematically illustrates the pupil signals collected from each of the cells (top left and top right of FIG. 8) and the differential signals from each of the cells which are defined below (bottom left and bottom right of FIG. 8).

The differential signal is defined as the signal intensity of a pixel p in the 1st order regime minus the corresponding intensity of the 180° rotated pixel, −p, in the −1st order regime. The per pixel signal differentials are denoted by D(p, offset) and may be approximated by the linear form expressed in Equation 8:

$$D_{1,2}(\vec{p},\pm f_0)=A(\vec{p})\cdot(OVL\pm f_0)$$

i.e., $D_1(\vec{p},+f_0)=A(\vec{p})\cdot(OVL+f_0)$ and $$D_2(\vec{p},-f_0)=A(\vec{p})\cdot(OVL-f_0) \qquad \text{Equation 8}$$

The indices 1, 2 of the differential signal D, denote the cell on which the signal is measured, having an induced offset equal to $\pm f_0$. A(p) is defined over the pupil and is analyzed in more details below.

FIG. 8 schematically illustrates pupil signals and differential signals of two cells with opposite offsets, according to some embodiments of the invention. Pupil images 95A and 95B are simulated measurement of cells 90 having designed offsets of $+f_0$ and $-f_0$ respectively. Each pupil image illustrates a central zeroth order diffraction signal and two first order diffraction signals marked −first and +first orders. The units are arbitrary and arrows indicate the correspondence of the dark areas to either of the two scale extremes. $NA_x$ and $NA_y$ denote the pupil plane relative coordinates. Differential signals 252A, 252B correspond to $D_1$ and $D_2$ as defined in Equation 8, with similar representation of the scale.

Using the definitions of Equation 8, the per-pixel overlay (OVL) is given by Equation 9, with $\vec{p}$ denoting the pupil pixel of the imaging element (e.g. a CCD-charge coupled device):

$$OVL(\vec{p}) = \frac{D_1(\vec{p}) + D_2(\vec{p})}{D_1(\vec{p}) - D_2(\vec{p})} f_0 \qquad \text{Equation 9}$$

Equation 9 thus defines the per-pixel overlay pupil image.

The pupil fidelity metrics are designed to quantify the validity of the assumptions that underlie the scatterometry overlay (SCOL) paradigm as explained below, and may be aimed towards finding best measurement conditions together with optimal target design for generating accurate overlay values, and towards providing estimates, in running time (RUN) or during a preparatory stage (TRAIN), for the inaccuracy induced (non-TMU) level of overlay confidence.

In case of perfect accuracy, or zero inaccuracy, the differential signals are denoted by Equation 8, with A(p) being an identical per-pixel vector for both cells. In certain embodiments, the fidelity metrics may compare $A_1(p)$ and $A_2(p)$ relating to the respective cells by deriving a per-pixel fit of $A_1$ to $A_2$ with Equation 10:

$$A_{1,2}(\vec{p}) = D_{1,2}(\vec{p})/(OVL \pm f_0) \qquad \text{Equation 10}$$

i.e., $$A_1(\vec{p}) = \frac{D_1(\vec{p})}{OVL + f_0} \text{ and } A_2(\vec{p}) = D_2(\vec{p})/(OVL - f_0)$$

where the raw pupil images of the differential signals are denoted by $D_{1,2}$ and an estimate of the overlay is denoted by OVL. One estimate for the overlay can be, for example, the result of the nominal overlay algorithm.

Figure 9:
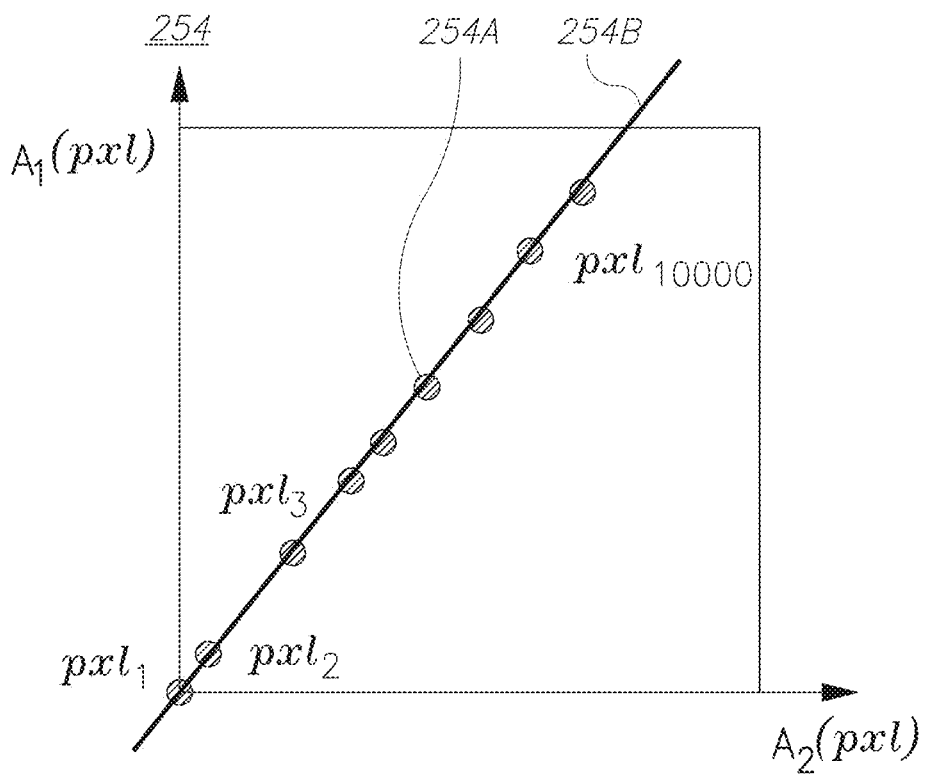
FIG. 9 is a diagram that schematically illustrates the calculation of fidelity metrics from a fitting curve between pupil functions for cells opposite designed offsets, according to some embodiments of the invention.

FIG. 9 is a diagram 254 that schematically illustrates the calculation of fidelity metrics from a fitting curve 254B between pupil functions for cells opposite designed offsets, according to some embodiments of the invention. The pupil functions $A_1$ and $A_2$ are represented on the axes and the individual values are represented as dots 254A, to which curve 254B is fitted. In the ideal case, in which $A_1=A_2$ over the whole pupil, curve 254B would be the identity fitting. The fidelity metrics may quantify the deviations from identity by measuring, e.g., the slope of curve 254B (the closer to 1 the better), the $R^2$ (the closer to 1 the better), the intercept (the smaller the better) as well as any statistical parameter of the correspondence of $A_1$ and $A_2$ over the pupil pixels. The fit can be a least square fit which may or may not be weighted.

In certain embodiments, pupil fidelity metrics may be derived from the fits described above in relation to FIG. 5, where the fidelity metric(s) may be calculated with respect to the quality of fitting of curve to measurements, for example, the overlay obtained from the fit provides an alternative overlay value that can be compared to the nominal overlay algorithm result. A large difference reflects an existing inaccuracy of at least one of the two algorithms. Moreover, the level of sensitivity of the resulting the chosen per-pixel weight may be quantified, in [nm], to yield an additional pupil fidelity metric.

Alternatively or complementarily, goodness of fit measures may be used as an indication of noise in the measurement, meaning a low quality pupil image. An additional fidelity metric may comprise the parameters of the function H and its distance from zero.

In certain embodiments, the fidelity metric(s) may be derived by averaging the signals across the pupil, i.e., using the averages of the quantities as described above in relation to FIG. 5, and performing a fit to these averages to obtain the overlay. In certain embodiments, higher statistical moments of the signals may be analyzed across the pupil. Higher pupil moments of the signals may be used to avoid such a cancellation and extract the sign, if lost, from the first moment. The newly obtained OVL value may be compared with the nominal OVL value and the difference may serve as a pupil fidelity metric. Also, quantifying, in [nm], the level of sensitivity of the resulting overlay to the chosen per-pixel weight, results in additional pupil fidelity metrics.

In certain embodiments, pupil noise may be used as a fidelity metric which combines several different overlay calculation methods in order to estimate the uncertainty of the overlay calculation, as exemplified below.

Pupil noise metric(s) may be calculated as follows. A set of overlay calculation methods may be selected, e.g., a nominal SCOL algorithm, a modified fit (see above), a pupil integral method (see above), etc. A corresponding set of characteristic parameters for each overlay calculation method may be defined. One specific example would be to choose different weights (for example, a nominal weight and its $q^{th}$ powers, or thresholds). Then, the overlay may be calculated using each method and each parameter value once for data coming from 0° wafer rotation and once for 180° wafer rotation. Calculating both orientations is a desired but not necessary step. An estimate is then calculated for the statistical error for each overlay value received. For example, $$\frac{|OVL_0 - OVL_{180}|}{2}$$

may be used as an estimate. This step may be dropped, for example the overlay is not calculated in the 180° orientation. Finally, the overlay values obtained by modifying the weights may be explored, and corresponding metric(s) may be defined to express the variability of the overlay value in the space of variations. For example, the difference between the highest overlay value received and the lowest one may be calculated, using only values that have a low statistical error. The pupil noise metric is generating an uncertainty in nanometers units for each measurement point.

In application, the fidelity metric(s) such as the statistics presented above may be analyzed across the wafer in a recipe optimization stage. These statistics can help fab owners to select the best measurement setup and the best target design per layer that results in accurate overlay values. The fidelity metric(s) such as the statistics presented above may be also inspected during operation, in RUN, and flag(s) may be derived from them to indicate unstable process effects.

Figure 10:
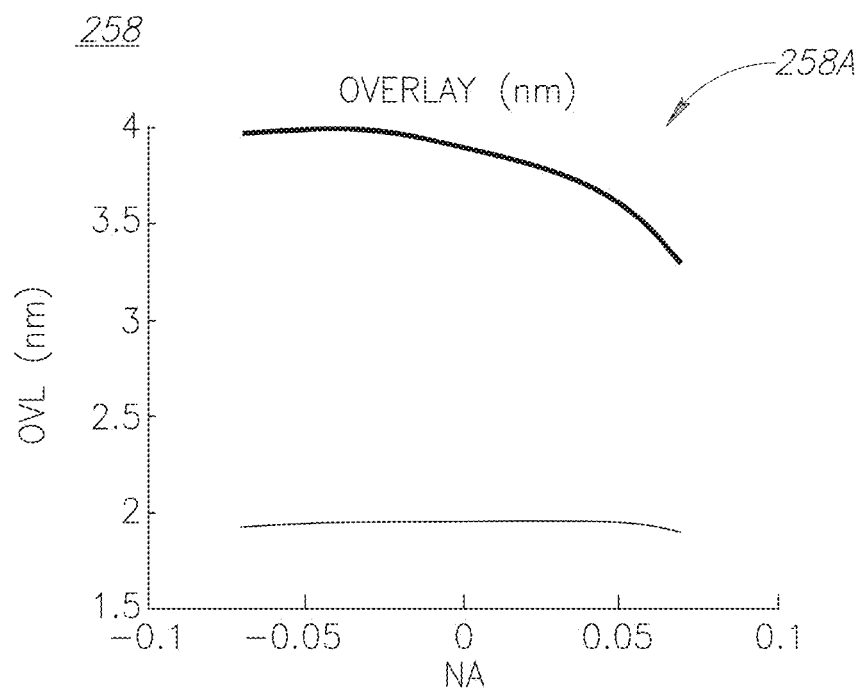
FIG. 10 is a diagram that exemplifies a result that indicates asymmetric overlay estimations around the center of the pupil plane, for a simulation performed on a stack with inaccuracy induced by process variation, according to some embodiments of the invention; and, FIG. 11 is a high level flowchart illustrating a method, according to some embodiments of the invention.

In certain embodiments, fidelity metric(s) may reflect a gradient in the per-pixel overlay around k=0 (the center of the pupil plane). Simulations have shown, that an asymmetric structure exhibited by the per-pixel overlay around k=0, with a significant gradient of the overlay in some direction, indicates significant inaccuracy. FIG. 10 is a diagram 258 that exemplifies a result that indicates asymmetric overlay estimations 258A around the center of the pupil plane, for a simulation performed on a stack with inaccuracy induced by process variation, according to some embodiments of the invention. The stack that is of resist over silicon was simulated. The graphs show the per-pixel OVL profile in the center of the pupil at NA (numerical aperture) between −0.1 and 0.1, for a stack without process variations (bottom, thin line) and a stack with process variation (top, thick line). The asymmetric stack exhibits an asymmetry around k=0 indicated by arrow 258A. FIG. 10 thus illustrates the profile of the per-pixel overlay obtained at the center of the pupil and shows that in case of inaccuracy inducing process variation in the stack, the center of the pupil exhibits a large asymmetry of the per-pixel overlay around k=0.

In certain embodiments, pixels may be assigned weights in any of the calculations of fidelity metrics presented above. In certain embodiments, the per-pixel weights may be defined in the space that is conjugate to the pupil space. Specifically one can choose to enhance the weight of features in the pupil (either in the overlay per-pixel map or in the differential signal per-pixel map, or in both) that have pupil length scales that are of a specific size. To achieve this, one can perform a Fourier decomposition of the overlay per pixel map (or the signals themselves) and modify the weight of Fourier components of the distribution that are in a certain regime of the pupil Fourier (conjugate) space.

Such modifications of the per-pixel weights may generate different calculations of the overlay, which in turn may be compared and used to derive additional fidelity metrics, and the difference between these calculations may be used as a flag for inaccuracy.

In certain embodiments, fidelity metric(s) may be derived to indicate the regions of three sigma ($\sigma$) of the respective distributions. Theoretically, each pixel within a per-pixel pupil image should report the same overlay value, as each pixel represents a different angle reflected from a single target cell. In reality different pixels report different overlay values due to inaccuracy. The magnitude of the variation between the pixels or between groups of pixels (which unlike single pixel satisfies a precision criterion) may be quantified and used as fidelity metric(s). It is noted that due to the carrying out of the measurements in the pupil plane, overlay and other measurements are independent for different pixels or pixel groups across the pupil, thus providing the opportunity to yield accurate estimation of the measurement inaccuracy to indicate process variation factors.

For example, a Pupil3s metric may be defined as in Equation 11:

$$Pupil3\sigma = 3 \cdot \sqrt{\frac{1}{\sum_p w(\vec{p})} \sum_p (OVL(\vec{p}) - \overline{OVL})^2 w(\vec{p})} \quad \text{Equation 11}$$

$$\text{with } \overline{OVL} = \frac{1}{w(\vec{p})} \sum_p OVL(\vec{p}) w(\vec{p})$$

and where p=pixel, OVL(p)=per pixel overlay and w(p)=per-pixel weight.

In some cases, the weighted estimate of Pupil3s presented in Equation 11 might have small correlation to accuracy because the Regions3s is a metric of variation across the per-pixel pupil only between averaged groups of pixels instead of per pixel variability. An example of such cases is when the pupil suffers from interference effects originating from known physical structures on the tool (aperture size) or on the wafer (target size). Another example is the presence of an asymmetry in the direction that is perpendicular to the grating. In the following, we present a metric that permits to reduce the Pupil3s due to this specific asymmetry. Those structures hold a small length scale on pupil such that the fluctuations cancel out when averaging across the pupil. A metric that disentangles this effect is the Region3s metric derived below, which may be used as a fidelity metric. The pupil is divided into regions with of $$\text{pupil region} \approx \frac{\lambda}{L/2} \times \frac{\lambda}{L/2},$$

where $\lambda$ is the wavelength the measurement is run with, and L is the physical length scale causing the phenomena.

Each region's overlay may be calculated, using the per-pixel weightings, and averaged according to Equation 12:

$$OVL_R = \frac{\sum_{pxl \in R} W_{pxl} OVL_{pxl}}{\sum_{pxl \in R} W_{pxl}} \quad \text{Equation 12}$$

where R is a region and $$W_R = \frac{\sum_{pxl \in R} W_{pxl}}{\sum_R \sum_{pxl \in R} W_{pxl}}.$$

Only regions which satisfy the following condition of a statistical error are used for the calculations $$\frac{|OVL_0 - OVL_{180}|}{2} < \text{threshold [nm]}.$$

The estimate of the regions' pupil sigma is calculated as $$\overline{OVL} = \frac{\sum OVL_R W_R}{\sum W_R}$$

to yield the definition of the Region 3s fidelity metric in Equation 13:

$$Region3s = 3\sqrt{\frac{\sum (OVL_R - \overline{OVL})^2 W_R}{\sum W_R}} \quad \text{Equation 13}$$

Repeating the above algorithm for a variety of length scales, L, allows one to define a series of fidelity metrics, which, in turn, enable pinpointing the length scale that causes inaccuracy. For example, if the physical process that causes inaccuracy corresponds to a length scale L1 on the wafer, then the overlay per-pixel and signals per pixel are expected to have per-pixel fluctuations on the scale of $\lambda/L1$. Then, by looking at the Regions3S for L<L1, fluctuations are integrated and the Regions3S fidelity does not contain any inaccuracy information. Therefore, the correlation of Regions3S to inaccuracy increases significantly for L=L1, thus indicating the size of the source of interference.

Certain embodiments comprise using as fidelity metric(s) an asymmetry metric in a direction that is perpendicular to the periodic structures. In the following, the direction of the periodicity of the periodic structures (e.g., gratings) is denoted by X and the direction orthogonal to X is denoted Y, without any limitation of the generality of the proposed methods and metrics. A symmetry breaking in the direction of the gratings (X) may be detected across a pupil image and used to indicate an overlay error. However, a symmetry breaking in the perpendicular direction to the overlay (Y) may indicate a different error that needs to be taken into account. This kind of symmetry breaking indicates possible process variation (for example, physical sidewall angle in the Y direction, target imperfection like an OVL in the Y direction between the segmentations in the top and top gratings), or any other symmetry breaking in the Y direction (for example diffraction\scattering effect of light from the edge of the target\target surrounding along the Y axis). The following fidelity metrics are termed Yasymmetry metrics, and are aimed to indicate and quantify the three latter errors that can happen on a semiconductor wafer. To put things in a more general perspective: for a SCOL target measuring the OVL in the "A" direction we use the Basymmetry flag which is checking for the symmetry in the pupil images of pixels that are reflected with respect to the B direction and that B is the orthogonal direction to A.

In certain embodiments, fidelity metric(s) indicating orthogonal asymmetry may be derived by generating a pupil image (either a differential signal or per pixel overlay), flipping the pupil into the orthogonal direction to the overlay's direction and calculating average and $3\sigma$ across the new flipped pupil.

The Yasymmetry metric may be derived from a per-pixel calculation that can be applied to either the differential signals pupils or the overlay pupil image. While the Yasymmetry is generated in nanometers for the overlay pupil image, it has a percentage form on the differential signals pupil images. In the latter fashion, Yasymmetry can pinpoint to the specific cell on which the process variation is more significant.

The Y asymmetry metric may be calculated in real time and can be used as a culling parameter or a quality measure to distinguish between different measurement setups, target designs, special zones on the wafer or within the field. Its behavior and statistics across the wafer can reveal process variations and can help in setting the optimal measurement conditions per layer, per wafer and/or per target design.

Several algorithms may be applied for pupil averaging, though there's also an option of reporting the Yasymmetry per pixel. One of the algorithms for pupil averaging is proposed in the following. Taking as a starting point two differential signals D1(px,py) and D2(px,py) (D1 belongs to a cell with induced offset $+f_0$ and D2 to cell with induced offset $-f_0$, as in Equation 8), and a per pixel overlay OVL(px,py). (px,py) denotes the pixels coordinates in mask or pupil plane; px in the direction along which the OVL is measured and py in the orthogonal direction. The asymmetry in the OVL (in nanometers) and the percentage per-pixel relative asymmetry in the differential signal, for cell i=1 and cell i=2, may be calculated by comparing the pupil image with its reflection in the perpendicular direction, i.e., (px,py) compared with (px,-py) as expressed in Equations 14:

$$YasymPP(OVL)[px, py] = \frac{1}{2}(OVL[px, py] - OVL[px, -py])$$

Equation 14

$$YasymPP(Di)[px, py] = 100 \times \frac{\frac{1}{2}(Di[px, py] - Di[px, -py])}{|Di[px, py]|}$$

which are per-pixel quantities defined only for py>0.
The per pixel overlay cleaned from Y asymmetry can be calculated in the following way:

$$YsymPP(OVL)[px,py] = \frac{1}{2}(OVL[px,py] + OVL[px,-py])$$

The per-pixel overlay is symmetrized. Following Equation 13, the Pupil3S reduced from Y asymmetry can be calculated. It permits to cancel the part of the inaccuracy on the Pupil3S that is due to Y asymmetry issues.

Flags may be calculated by defining the weighted pupil average of a $$\text{quantity}\langle Q \rangle \equiv \frac{\sum_p Q(p)W(p)}{\sum_p W(p)},$$

but now the weights change with i=1,2 and the sum in the averages is only on py>0. The flags are defined to be as expressed in Equations 15:

$$Yasym(OVL) \equiv \langle YasymPP(OVL) \rangle_{w_0},$$

Equations 15

$$Yasym(OVL)3S \equiv$$

$$3\sqrt{\langle YasymPP(OVL)^2 \rangle_{w_0} - (\langle YasymPP(OVL) \rangle_{w_0})^2}.$$

$$Yasym(Di) \equiv \langle Yasym(Di) \rangle_{w_i},$$

$$Yasym(Di)3S \equiv$$

$$3\sqrt{\langle YasymPP(Di)^2 \rangle_{w_i} - (\langle YasymPP(Di) \rangle_{w_i})^2}.$$

Another example for pupil averaging algorithm is as follows: the dependency of Yasymmetry on the overlay (in the orthogonal direction) can be almost nullified by using the following metric, expressed in Equation 16:

$$Yasymmetry = \left\langle \frac{\Delta D1(kx, ky) + \Delta D2(kx, ky)}{|D1(kx, ky)| + |D2(kx, ky)|} \right\rangle_{weighted}$$

Equation 16

Where $\Delta D1 = D1(kx, ky) - D1(kx, -ky),$ $\Delta D2 = D2(kx, ky) - D2(kx, -ky).$ It is noted that the derivation presented above increases linearly as a function of the offset in the perpendicular direction to the direction of the overlay. It is further noted that the Yasymmetry metric may be used to identify outliers across the wafer. The Yasymmetry metric, in any of its embodiments may be calculated while omitting measurements that lie outside the statistical boundaries of mean±3s. Since the Yasymmetry metric is a per-pixel metric, it can also be used as an outlier removal in the pixels level. One can apply the Yasymmetry metric to a pupil image, calculate mean and 3s of the Yasymmetry measure and set valid limits as mean±3s. All pixels that lie outside the valid range between those two limits may be omitted from the pupil used for per-pixel overlay calculations, or the final overlay calculation. The difference between the two types of OVL calculations (with and without the omitted pixels) may serve as an additional magnitude for the effect symmetry breaking in the orthogonal direction has on the OVL measurement quality.

In order to estimate the amount of uncertainty in Yasymmetry calculations, a validation stage may be added, in which the Yasymmetry metric is calculated in the standard manner, then with a shift by a pixel to the left and another shift by a pixel to the right. The variation between those three measures may generate the amount of uncertainty required for Yasymmetry metric calculations.

Simulations of different types of Yasymmetry breakings like orthogonal pitch in both layers have shown that, for a given wavelength, there is a rather sharp cross-over behavior from orthogonal pitch size that does cause significant inaccuracies to orthogonal pitch size that does not. For example for wavelengths in the blue regime such a cross-over behavior was observed to be around pitch ~250 nm. Such inaccuracy dependence on segmentation pitch may be used to restrict the contender list in metrology target design parameter space search.

In certain embodiments, Yasymmetry metrics may be used to identify corrupted targets or cells within a target on the wafer, bad measurement setup and process variations. Yasymmetry metrics may also be used to identify measurement points which are out of statistical range as outliers, and omit corresponding pixels as well. In certain embodiments, Yasymmetry metrics may be used to quantify symmetry breaking and indicate target imperfections (down to cell level), biased measurement setup or different process variation. Yasymmetry units may be nanometers when applied to overlay pupil image and percentages when applied to raw signal pupil images. Yasymmetry metrics in nanometers may be used to estimate the effect of process problem on the overlay inaccuracy. Yasymmetry metrics may be calculated on the tool in real time while the overlay is measured. Yasymmetry metrics may be used as a culling parameter or a quality measure across wafer or field, distinguishing between measurement setups, different target designs, different fields, wafers or lots.

Returning to FIG. 11, method 100 may be at least partially implemented by at least one computer processor, e.g., in a metrology module. Certain embodiments comprise computer program products comprising a non-transitory computer readable storage medium having a computer readable program embodied therewith and configured to carry out of the relevant stages of method 100.

Method 100 may comprise measuring a diffraction signal comprising at least ±first diffraction orders at a pupil plane of a metrology tool, the signal derived from a target comprising at least two cells, each having at least two periodic structures having opposite designed offsets $\pm f_0$ (stage 250), and calculating, from the measured diffraction signals of the at least two cells, an overlay of the target using differences between signal intensities of opposing orders measured at pupil pixels which are rotated by 180° with respect to each other, at each cell (stage 260).

In certain embodiments, the overlay may be calculated as $OVL(\vec{p})=((D_1(\vec{p})+D_2(\vec{p}))/(D_1(\vec{p})-D_2(\vec{p}))) \cdot f_0$, with $\vec{p}$ representing the pupil pixel, $f_0$ denoting the designed offset, and with $D_1$ and $D_2$ denoting, corresponding to the opposite designed offsets, the differences between signal intensities of opposing orders measured at pupil pixels which are rotated by 180° with respect to each other.

Method 100 may further comprise deriving at least one fidelity metric from an estimated fit between pupil functions, for the opposite designed offsets, derived from the differences between signal intensities of opposing orders measured at pupil pixels which are rotated by 180° with respect to each other (stage 270). For example, the at least one fidelity metric may be derived from a linear fit of $D_1(\vec{p})+D_2(\vec{p})$ and $D_1(\vec{p})-D_2(\vec{p})$.

Method 100 may comprise deriving at least one fidelity metric by comparing a nominal overlay value with an overlay value derived by integrating, across the pupil, the differences between signal intensities of opposing orders measured at pupil pixels which are rotated by 180° with respect to each other (stage 280). In certain embodiments, the derived overlay value may be calculated by integrating $D_1(\vec{p})+D_2(\vec{p})$ across the pupil, with $\vec{p}$ representing the pupil pixel, and $D_1$ and $D_2$ denoting, corresponding to the opposite designed offsets, the differences between signal intensities of opposing orders measured at pupil pixels which are rotated by 180° with respect to each other. Integrating 280 may comprise integrating a first and/or higher moment(s) of these differences (stage 285). For example, the integration may be carried out with respect to an average of $D_1(\vec{p})+D_2(\vec{p})$ as explained above, and/or the integration may be carried out with respect to a second or higher moment of $D_1(\vec{p})+D_2(\vec{p})$.

Method 100 may further comprise, in any of the embodiments, weighting the pupil pixels to derive the at least one fidelity metric (stage 310). For example, in embodiments involving fitting a curve to multiple points (e.g., corresponding to different pixels), the at least one fidelity metric may comprise a weighted chi-squared measure of the estimated fit. In certain embodiments, the weights may be defined in a conjugate space to the pupil (stage 315), such as the Fourier conjugate plane.

In certain embodiments, method 100 may comprise deriving at least one fidelity metric using at least two overlay values, associated with corresponding parameters and derived by at least corresponding two of (i) deriving a nominal overlay value using a scatterometry algorithm (i.e., using prior art methods), (ii) estimating a fit between pupil functions, for the opposite designed offsets, derived from the differences between signal intensities of opposing orders 270, and (iii) comparing a nominal overlay value with an overlay value derived by integrating, across the pupil, the differences between signal intensities of opposing orders measured at pupil pixels which are rotated by 180° with respect to each other (e.g., by stage 280). The at least one fidelity metric may be defined to quantify a pupil noise that corresponds to a variability of the difference between the derived at least two overlay values under different parameter values (stage 300). For example, the parameters comprise different weightings of the pupil plane pixels. In certain embodiments, quantification 300 of the pupil noise may be carried out with respect to overlay differences at pupil pixels which are rotated by 180° with respect to each other (stage 305) measured at pupil pixels which are rotated by 180° with respect to each other (e.g., by stage.)

Method 100 may comprise deriving at least one fidelity metric from a variation of the calculated overlay between groups of pupil pixels, wherein a size of the groups is selected according to a specified length scale related to an expected source of interference in an optical system of the metrology tool (stage 320). The size of the groups may be selected in the scale of $\lambda/(L/2)$, with $\lambda$ the illumination wavelength and L the size of the expected source of interference (stage 325).

In certain embodiments, method 100 may further comprise selecting and optimizing a measurement recipe according to the at least one fidelity metric (stage 330).

In certain embodiments, method 100 may comprise calculating an asymmetry metric of the overlay with respect to the center of the pupil plane (stage 290).

Method 100 may further comprise calculating an asymmetry metric in a direction that is perpendicular to the periodic structures (stage 340), e.g., with respect to the measured diffraction signals and/or the overlay, and by applying statistical analysis of a pupil image that is reflected in the perpendicular direction −(px,py) compared with (px,−py).

Advantageously, pupil fidelity metrics offer several methods for estimating a pupil's validity in its raw form (as a differential signal) and its final per-pixel overlay form. Most of those magnitudes are in nanometer units which simplify their interpretation and offer a measure of uncertainty. Some of the pupil fidelity metrics are quantifying the level by which the scatterometry overlay algorithm assumptions hold. Those metrics offer a theory check for use cases in which the process variation caused the target cells a corruption even to the extent of not allowing the theory assignment to the physical structures on the wafer. Those metrics can be used in a single measurement level and in a wafer level, helping fab owners find corrupted zones on the wafers, best measurement setup and target design per layer for achieving accurate overlay results. The pupil fidelity metrics can be calculated in real time, offering per measurement point quality measures and wafer statistics measures which will state optimal measurement setup and target design for maximizing the fab's yield by reporting accurate overlay values.

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their used in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
deriving an at least partially continuous dependency of at least one metrology metric on at least one recipe parameter, by simulation or in preparatory measurements;
analyzing the derived dependency;
determining a metrology recipe according to the analysis; and,
conducting at least one metrology measurement according to the determined recipe, wherein the at least one metrology measurement comprises an overlay metrology measurement of a grating-over-grating scatterometry target or a side-by-side scatterometry target and the at least one recipe parameter is related to an optical path difference between the gratings and comprises at least one of: a thickness of intermediate layers between the gratings, a measurement wavelength, an angle of incidence, an angle of reflectance, polarization properties of incident and reflected light, target geometric parameters or electromagnetic characteristics of the gratings and of the intermediate layers between the gratings.

2. The method recited in claim 1, wherein the analysis comprises identifying at least one extremum in the at least partially continuous dependency.

3. The method recited in claim 1, further comprising determining the metrology recipe analytically by nullifying a derivative of the at least partially continuous dependency.

4. The method recited in claim 1, wherein the deriving is carried out on the fly.

5. The method recited in claim 1, wherein the at least one overlay metrology measurement is of an imaging target and the at least one recipe parameter is related to an optical path difference between target structures and comprises at least one of: a thickness of intermediate layers between the target structures, a measurement wavelength, an angle of incidence, an angle of reflectance, polarization properties of incident and reflected light, target geometric parameters, electromagnetic characteristics of the target structures and of Intermediate layers between the target structures, and measurement tool focus.

6. The method recited in claim 1, further comprising distinguishing asymmetric process variation from symmetric process variation by simulating or measuring an effect thereof on the derived dependency.

7. The method recited in claim 1, further comprising using an overlay variation measure as the at least one metrology metric.

8. The method recited in claim 1, further comprising identifying resonances in an intermediate film stack between target structures according to the at least partially continuous dependency.

9. The method recited in claim 1, further comprising estimating a per-pixel signal contamination by comparing estimation and measurement data of the at least one metrology metric.

10. The method recited in claim 1, further comprising calculating the at least one metrology metric according to at least one weight function applied to a plurality of pupil pixels that are measured in the at least one metrology measurement, to achieve low inaccuracy, wherein the at least one weight function is determined with respect to the at least partially continuous dependency.

11. The method recited in claim 10, wherein the at least one overlay metrology measurement is of a grating-over-grating scatterometry target or a side-by-side scatterometry target and the at least one weight function is further determined with respect to a relation between an expected signal directionality and a given illumination directionality.

12. The method recited in claim 1, wherein the at least partially continuous dependency is a sensitivity landscape of the at least one metrology metric with respect to the at least one recipe parameter.

13. The method recited in claim 12, further comprising identifying points or contours of zero sensitivity in the sensitivity landscape and conducting the at least one metrology measurement at a region around the points or contours of zero sensitivity with respect to a set of parameters.

14. The method recited in claim 13, further comprising using single or multiple scattering models to identify the points or contours of zero sensitivity in the landscape.

15. The method recited in claim 13, further comprising binning signals from portions of a subspace spanned by the set of parameters.

16. The method recited in claim 13, further comprising selecting an illumination spectral distribution according to the identified points or contours of zero sensitivity in the landscape.

17. The method recited in claim 13, further comprising binning signals from portions of a pupil according to the identified points or contours of zero sensitivity in the landscape.

18. The method recited in claim 17, further comprising optimizing at least one of a metrology recipe and hardware settings to achieve low inaccuracy according to the sensitivity landscape.

19. The method recited in claim 18, further comprising tuning at least one hardware parameter to the points or contours of zero sensitivity in the sensitivity landscape.

20. The method recited in claim 1, further comprising interpolating or extrapolating a continuous artificial signal landscape from discrete measurements or data of the at least partially continuous dependency.

21. The method recited in claim 20, further comprising constructing the continuous artificial signal landscape by fitting the discrete measurements or data to an underlying physical model.

22. The method recited in claim 20, further comprising applying at least one cost function to the continuous artificial signal landscape for calculating a respective at least one metrology metric.

23. The method recited in claim 1, wherein the at least partially continuous dependency is a landscape of the at least one metrology metric with respect to the at least one recipe parameter.

24. The method recited in claim 23, further comprising characterizing the landscape by distinguishing flat regions from peaks.

25. The method recited in claim 24, further comprising using relative signs of slopes of the landscape at consecutive peaks to determine whether a respective intermediate flat region between the consecutive peaks is an accurate flat region.

26. The method recited in claim 24, further comprising determining a required sampling density for different regions of the landscape according to peak locations in the landscape.

27. The method recited in claim 24, further comprising sampling the landscape at a high density at peak regions and at a low density at flat regions.

28. The method recited in claim 24, further comprising measuring a symmetric process robustness using relative sizes of peak regions and flat regions.

29. The method recited in claim 24, further comprising identifying the peaks according to a number of sign flips of the at least one metrology metric.

30. The method recited in claim 29, further comprising characterizing the identified peaks according to the number of sign flips of the at least one metrology metric as simple or complex peaks.

31. The method recited in claim 24, further comprising integrating the at least one metrology metric over at least one specified landscape region.

32. The method recited in claim 31, wherein the at least one metrology metric comprises at least an overlay.

33. The method recited in claim 24, wherein the at least one metrology metric comprises at least two metrology metrics, and further comprising correlating the at least two metrology metrics over specified landscape regions to validate the at least one metrology measurement.

34. The method recited in claim 23, further comprising deriving the landscape as a parametric landscape with respect to at least one parameter.

35. The method recited in claim 34, further comprising adjusting the at least one parameter to optimize the parametric landscape with respect to specified metrics.

36. The method recited in claim 35, wherein the adjusting is carried out to enhance an accuracy of an overlay measurement.

37. The method recited in claim 35, wherein the adjusting is carried out with respect to a phenomenological model.

38. The method recited in claim 34, wherein the deriving is carried out with respect to a plurality of measurements.

39. The method recited in claim 23, further comprising quantifying landscape shifts caused by symmetric process variation.

40. The method recited in claim 39, further comprising selecting measurement settings according to the quantified landscape shifts.

41. The method recited in claim 39, further comprising selecting measurement settings to exhibit low sensitivity to the quantified landscape shifts.

42. The method recited in claim 39, further comprising cancelling out the quantified landscape shifts by corresponding target or measurement designs which cause an opposite shift of the landscape.

43. The method recited in claim 39, further comprising fitting measurement parameters to different target sites according to the quantified landscape shifts in the respective target sites.

44. The method recited in claim 39, further comprising selecting an illumination spectral distribution according to the quantified landscape shifts.

45. The method recited in claim 23, further comprising designing metrology targets to yield low inaccuracy according to the landscape.

46. The method recited in claim 45, further comprising predicting resonances in an intermediate film stack between target structures according to the landscape and configuring the intermediate film stack to yield resonances at specified measurement parameters.

47. The method recited in claim 46, further comprising minimizing electromagnetic penetration below or at a target's lower structure.

48. The method recited in claim 47, further comprising designing the targets to have dummy-fill or segmentation at or below their lower layer.

49. The method recited in claim 45, further comprising performing metrology measurements of the designed targets.

50. The method recited in claim 49, wherein the landscape is a sensitivity landscape and further comprising measuring an overlay at low or zero inaccuracy points or contours of the sensitivity landscape.

51. The method recited in claim 45, further comprising performing metrology measurements at flat regions of the landscape.

52. A method comprising:
   measuring a diffraction signal comprising at least ±first diffraction orders at a pupil plane of a metrology tool, the signal derived from a target comprising at least two cells, each having at least two periodic structures having opposite designed offsets;
   calculating, from the measured diffraction signals of the at least two cells, an overlay of the target using differences between signal intensities of opposing orders measured at pupil pixels which are rotated by 180° with respect to each other, at each cell; and
   determining at least one fidelity metric, wherein the determining at least one fidelity metric comprises: determining at least one fidelity metric from a variation of the calculated overlay between groups of the pupil pixels, wherein a size of the groups is selected according to a specified length scale related to an expected source of interference in an optical system of the metrology tool.

53. The method recited in claim 52, wherein the overlay is calculated as $OVL_p = ((D1p+D2p)D1p-D2p) \cdot f_0$, with p representing the pupil pixel, $f_0$ denoting the designed offset, and with $D_1$ and $D_2$ denoting, corresponding to the opposite designed offsets, the differences between signal intensities of opposing orders measured at pupil pixels which are rotated by 180° with respect to each other.

54. The method recited in claim 52, wherein the determining at least one fidelity metric comprises: at least one fidelity metric from an estimated fit between pupil functions, for the opposite designed offsets, derived from the differences between signal intensities of opposing orders measured at pupil pixels which are rotated by 180° with respect to each other.

55. The method recited in claim 54, wherein the at least one fidelity metric is derived from a linear fit of D1p+D2p and D1p−D2p.

56. The method recited in claim 54, further comprising weighting the pupil pixels to derive the at least one fidelity metric.

57. The method recited in claim 56, wherein the at least one fidelity metric comprises a weighted chi-squared measure of the estimated fit.

58. The method recited in claim 52, wherein the determining at least one fidelity metric comprises: comparing a nominal overlay value with an overlay value derived by integrating, across the pupil, the differences between signal intensities of opposing orders measured at pupil pixels which are rotated by 180° with respect to each other.

59. The method recited in claim 58, the derived overlay value is calculated by integrating D1p+D2p across the pupil, with p representing the pupil pixel, and $D_1$ and $D_2$ denoting, corresponding to the opposite designed offsets, the differences between signal intensities of opposing orders measured at the pupil pixels which are rotated by 180° with respect to each other.

60. The method recited in claim 59, wherein the integration is carried out with respect to an average of D1p+D2p.

61. The method recited in claim 60, wherein the integration is carried out with respect to a second or higher moment of D1p+D2p.

62. The method recited in claim 58, further comprising weighting the pupil pixels to derive the at least one fidelity metric.

63. The method recited in claim 52, wherein the determining at least one fidelity metric comprises:
   determining at least one fidelity metric using at least two overlay values, associated with corresponding parameters and derived by at least corresponding two of:
   (i) deriving a nominal overlay value using a scatterometry algorithm,
   (ii) estimating a fit between pupil functions, for the opposite designed offsets, derived from the differences between signal intensities of opposing orders measured at pupil pixels which are rotated by 180° with respect to each other, and
   (iii) comparing a nominal overlay value with an overlay value derived by integrating, across the pupil, the differences between signal intensities of opposing orders measured at the pupil pixels which are rotated by 180° with respect to each other;
   wherein the at least one fidelity metric is defined to quantify a pupil noise that corresponds to a variability of the difference between the derived at least two overlay values under different parameter values.

64. The method recited in claim 63, wherein the parameters comprise different weightings of the pupil pixels.

65. The method recited in claim 63, wherein the quantification of the pupil noise is carried out with respect to overlay differences at pupil pixels which are rotated by 180° with respect to each other.

66. The method recited in claim 62 wherein the weighting is defined in a space that is conjugate to the pupil space.

67. The method recited in claim 66, wherein the conjugate space is a pupil Fourier conjugate space.

68. The method recited in claim 52, wherein the size of the groups is selected in the scale of $\lambda/(L2)$, with $\lambda$ the illumination wavelength and L is the size of the expected source of interference.

69. The method recited in claim 52, further comprising selecting a measurement recipe according to the at least one fidelity metric.

70. The method recited in claim 52, further comprising calculating an asymmetry metric of the overlay with respect to the center of the pupil plane.

71. The method recited in claim 52, further comprising calculating an asymmetry metric in a direction that is perpendicular to the periodic structures.

72. The method recited in claim 71, wherein the asymmetry metric is calculated with respect to at least one of the measured diffraction signals and the overlay.

73. The method recited in claim 71, wherein the asymmetry metric is calculated by applying statistical analysis of a pupil image that is reflected in the perpendicular direction.

74. A method comprising:
   carrying out at least one measurement, related to a signal type, of at least one metrology metric using at least one recipe parameter;
   fitting the at least one measurement to a phenomenological model that describes a dependency of the signal type on the at least one metrology metric and at least one deviation factor; and
   deriving, from the fitting, at least one respective corrected metrology metric.

75. The method recited in claim 74, further comprising:
   determining a metrology recipe according to the at least one derived corrected metrology metric; and
   conducting at least one metrology measurement according to the determined recipe.

76. The method recited in claim 74, wherein the phenomenological model is derived from an at least partially continuous dependency of the at least one metrology metric on the at least one recipe parameter that is derived by simulation or in preparatory measurements.

77. The method recited in claim 74, wherein the at least one metrology metric comprises a target overlay.

* * * * *